United States Patent
Min et al.

(10) Patent No.: US 10,177,096 B2
(45) Date of Patent: Jan. 8, 2019

(54) SEMICONDUCTOR PACKAGE AND METHOD FOR MANUFACTURING THE SAME

(71) Applicant: SAMSUNG ELECTRONICS CO., LTD., Suwon-si (KR)

(72) Inventors: Byoung-Gug Min, Seongnam-si (KR); Sungil Cho, Asan-si (KR); Jaehoon Choi, Cheonan-si (KR); Shi-kyung Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/622,708

(22) Filed: Jun. 14, 2017

(65) Prior Publication Data

US 2017/0358540 A1    Dec. 14, 2017

Related U.S. Application Data

(60) Provisional application No. 62/349,917, filed on Jun. 14, 2016.

(30) Foreign Application Priority Data

Sep. 8, 2016    (KR) .................... 10-2016-0115857
Jun. 12, 2017   (KR) .................... 10-2017-0073395

(51) Int. Cl.
*H01L 29/93*   (2006.01)
*H01L 23/552*  (2006.01)
(Continued)

(52) U.S. Cl.
CPC .......... *H01L 23/552* (2013.01); *H01L 23/295* (2013.01); *H01L 21/561* (2013.01);
(Continued)

(58) Field of Classification Search
None
See application file for complete search history.

(56) References Cited

U.S. PATENT DOCUMENTS 5,557,142 A    9/1996  Gilmore et al.
7,700,411 B2   4/2010  Yang et al.
(Continued)

FOREIGN PATENT DOCUMENTS

KR   1020110113999 A   10/2011
KR      101317216 B1   10/2013
(Continued)

*Primary Examiner* — Calvin Choi
(74) *Attorney, Agent, or Firm* — Sughrue Mion, PLLC

(57) ABSTRACT

Semiconductor packages and a methods for manufacturing a semiconductor package are provided. The method includes providing a package including a substrate, a semiconductor chip provided on the substrate, and a molding layer provided on the substrate and covering the semiconductor chip, the substrate including a ground pattern exposed at one surface of the substrate; and applying a solution including metal particles and a conductive carbon material onto the molding layer to form a shielding layer covering the molding layer. The shielding layer includes the metal particles and the conductive carbon material connected to at least one of the metal particles. The shielding layer extends onto the one surface of the substrate and is electrically connected to the ground pattern.

20 Claims, 19 Drawing Sheets

(51) Int. Cl.
  *H01L 23/29* (2006.01)
  *H01L 23/31* (2006.01)
  *H01L 21/56* (2006.01)
  *H01L 23/00* (2006.01)

(52) U.S. Cl.
  CPC ...... *H01L 23/3128* (2013.01); *H01L 23/3135* (2013.01); *H01L 24/16* (2013.01); *H01L 2224/16227* (2013.01); *H01L 2224/97* (2013.01); *H01L 2924/15311* (2013.01); *H01L 2924/1815* (2013.01); *H01L 2924/3025* (2013.01)

(56) References Cited

U.S. PATENT DOCUMENTS

| | | | |
|---|---|---|---|
| 7,763,362 B2 | 7/2010 | Jablonski et al. | |
| 8,199,083 B2* | 6/2012 | Fukunaga | G06F 3/0421 345/73 |
| 9,049,777 B2 | 6/2015 | Beach et al. | |
| 2003/0081373 A1* | 5/2003 | Hamada | H01G 9/0425 361/502 |
| 2008/0061407 A1 | 3/2008 | Yang et al. | |
| 2008/0213609 A1 | 9/2008 | Jablonski et al. | |
| 2009/0166819 A1* | 7/2009 | Chen | B82Y 30/00 257/659 |
| 2010/0029823 A1 | 2/2010 | Hong et al. | |
| 2010/0315105 A1 | 12/2010 | Fornes | |
| 2012/0107538 A1 | 5/2012 | Beach et al. | |
| 2012/0300412 A1* | 11/2012 | Song | H01L 23/552 361/728 |
| 2013/0307128 A1* | 11/2013 | Lin | H01L 23/552 257/659 |

FOREIGN PATENT DOCUMENTS

| | | |
|---|---|---|
| KR | 101552978 B1 | 9/2015 |
| KR | 1020150117531 A | 10/2015 |

* cited by examiner

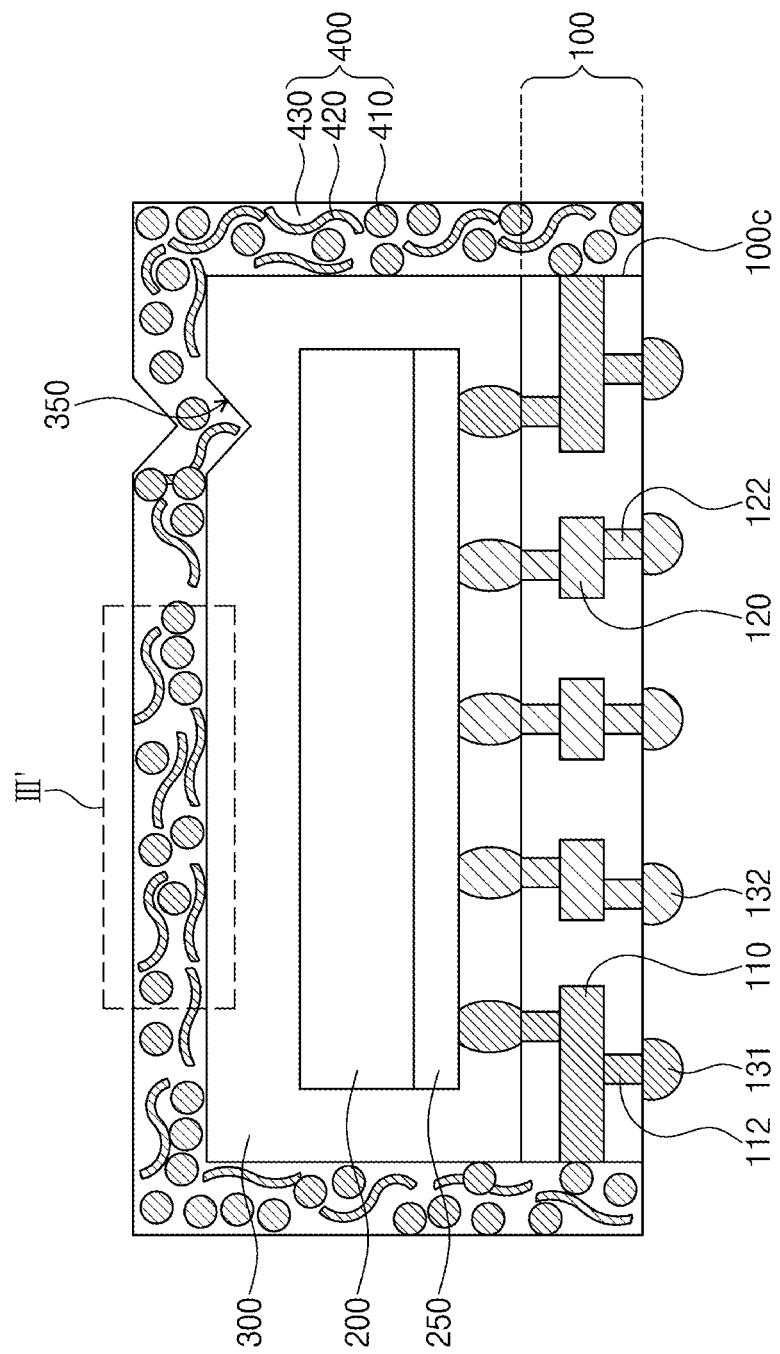

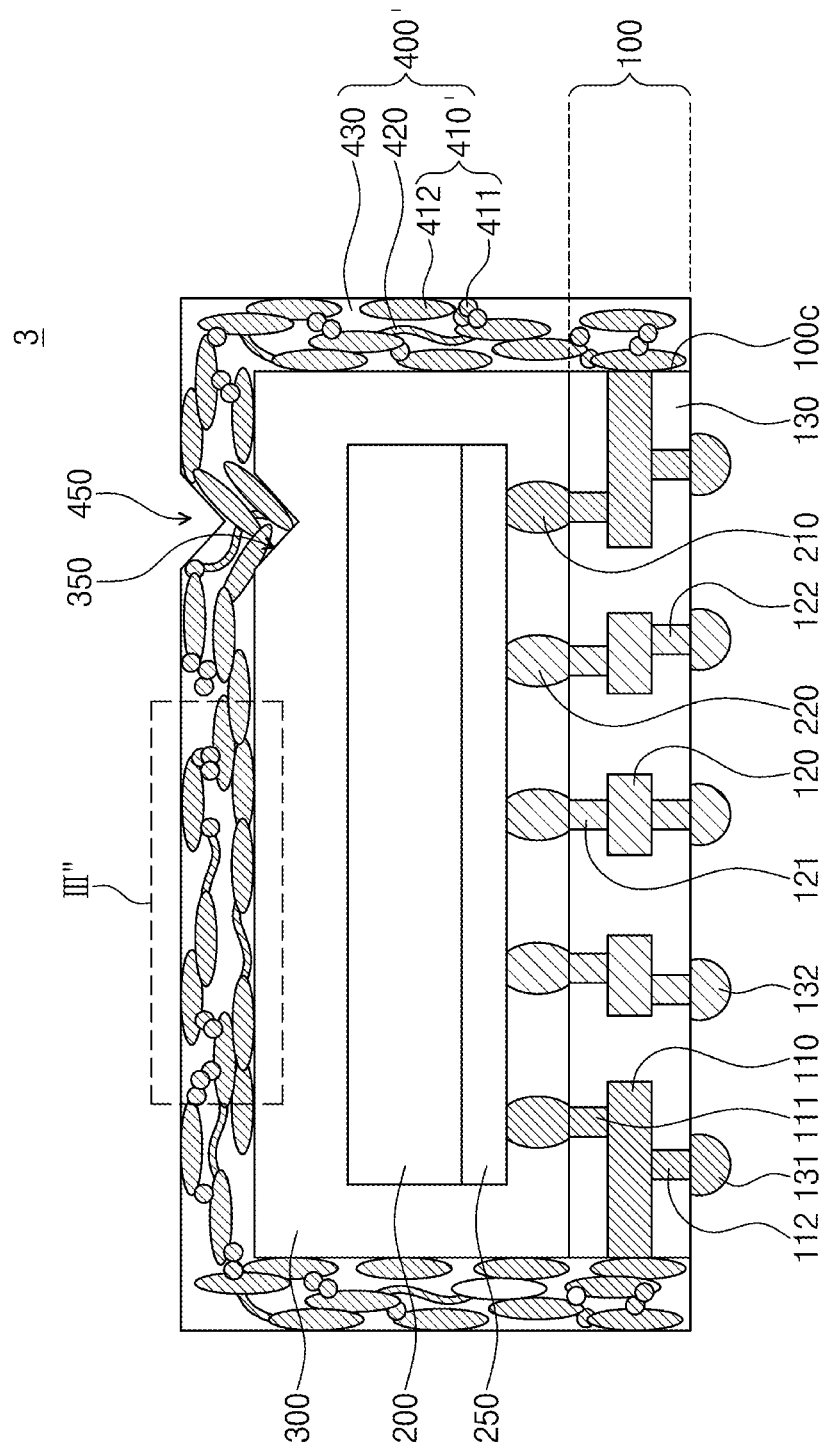

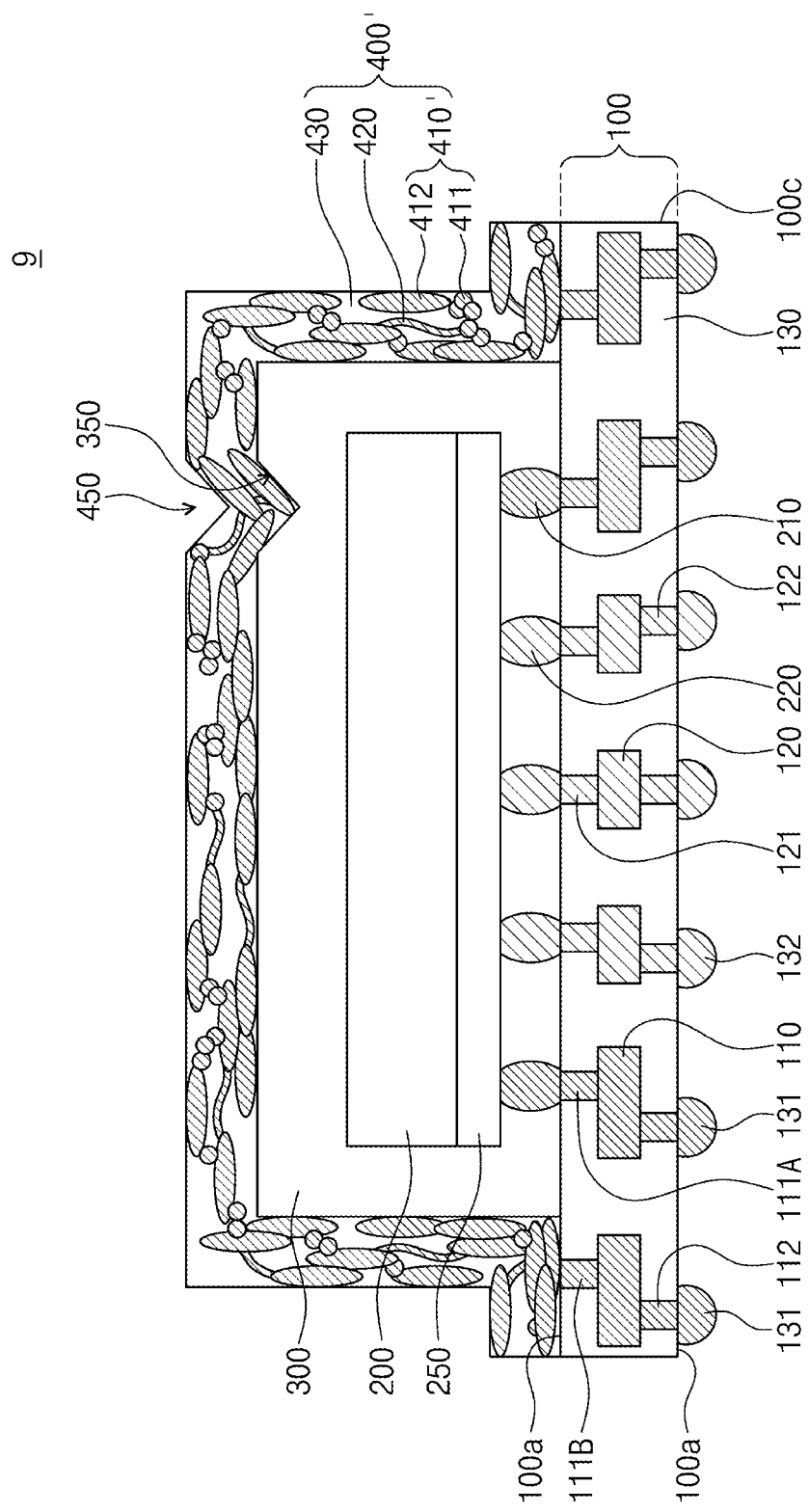

SEMICONDUCTOR PACKAGE AND METHOD FOR MANUFACTURING THE SAME

CROSS-REFERENCE TO RELATED APPLICATION

This application claims priority from U.S. Provisional Application No. 62/349,917, filed on Jun. 14, 2016 in the United States Patent and Trademark Office, and Korean Patent Application Nos. 10-2016-0115857 and 10-2017-0073395, filed on Sep. 8, 2016 and Jun. 12, 2017 in the Korean Intellectual Property Office, the disclosures of which are hereby incorporated by reference in their entireties.

BACKGROUND

Example embodiments of the present disclosure relate to a semiconductor package and a method for manufacturing the same and, more particularly, to a semiconductor package including a shielding layer and a method for manufacturing the same.

A semiconductor package including an integrated circuit chip may be a suitable form for using the integrated circuit chip in an electronic product. In a general semiconductor package, a semiconductor chip may be mounted on a printed circuit board (PCB) and may be electrically connected to the PCB through bonding wires or bumps. High-performance, high-speed and small electronic components have been developed with the development of an electronic industry. Thus, an electromagnetic interference phenomenon may occur between the semiconductor package and other electronic component.

SUMMARY

Example embodiments provide a semiconductor package and a method for manufacturing the same.

According to an aspect of an example embodiment, a method for manufacturing a semiconductor package may include providing a package including a ground pattern, and forming a shielding layer that is disposed on a top surface and a sidewall of the package and is electrically connected to the ground pattern. The shielding layer may include metal particles connected to each other, and a conductive carbon material electrically connected to at least one of the metal particles. The metal particles may include first particles having a first aspect ratio and second particles having a second aspect ratio that is greater than the first aspect ratio.

According to an aspect of another example embodiment, a method for manufacturing a semiconductor package may include providing a package including a substrate, a semiconductor chip provided on the substrate, and a molding layer provided on the substrate and covering the semiconductor chip, and applying a solution including metal particles and a conductive carbon material onto the molding layer to form a shielding layer covering the molding layer. The substrate may include a ground pattern exposed at one surface of the substrate. The shielding layer may include the metal particles and the conductive carbon material connected to at least one of the metal particles. The shielding layer may extend onto the one surface of the substrate and is electrically connected to the ground pattern. The one surface of the substrate may be one of a bottom surface and a sidewall of the substrate.

According to an aspect of another example embodiment, a semiconductor package may include a substrate including a ground structure that is exposed at one surface of the substrate, a semiconductor chip provided on the substrate, a molding layer provided on the substrate and covering the semiconductor chip, and a shielding layer provided on the molding layer and the one surface of the substrate. The shielding layer may be in contact with the ground structure. The shielding layer may include metal particles physically connected to each other, and a conductive carbon material connected to at least one of the metal particles.

BRIEF DESCRIPTION OF THE DRAWINGS

The above and/or other aspects will be more apparent by describing certain example embodiments with reference to the accompanying drawings, in which:

FIGS. 2A, 2B and 2C are cross-sectional views illustrating a method for manufacturing a semiconductor package according to an example embodiment;

FIG. 4A is a cross-sectional view illustrating a semiconductor package according to an example embodiment;

FIG. 10 is a cross-sectional view illustrating a semiconductor package according to an example embodiment.

DETAILED DESCRIPTION

Semiconductor packages and methods for manufacturing the same according to some example embodiments will be described hereinafter.

Figure 1A:
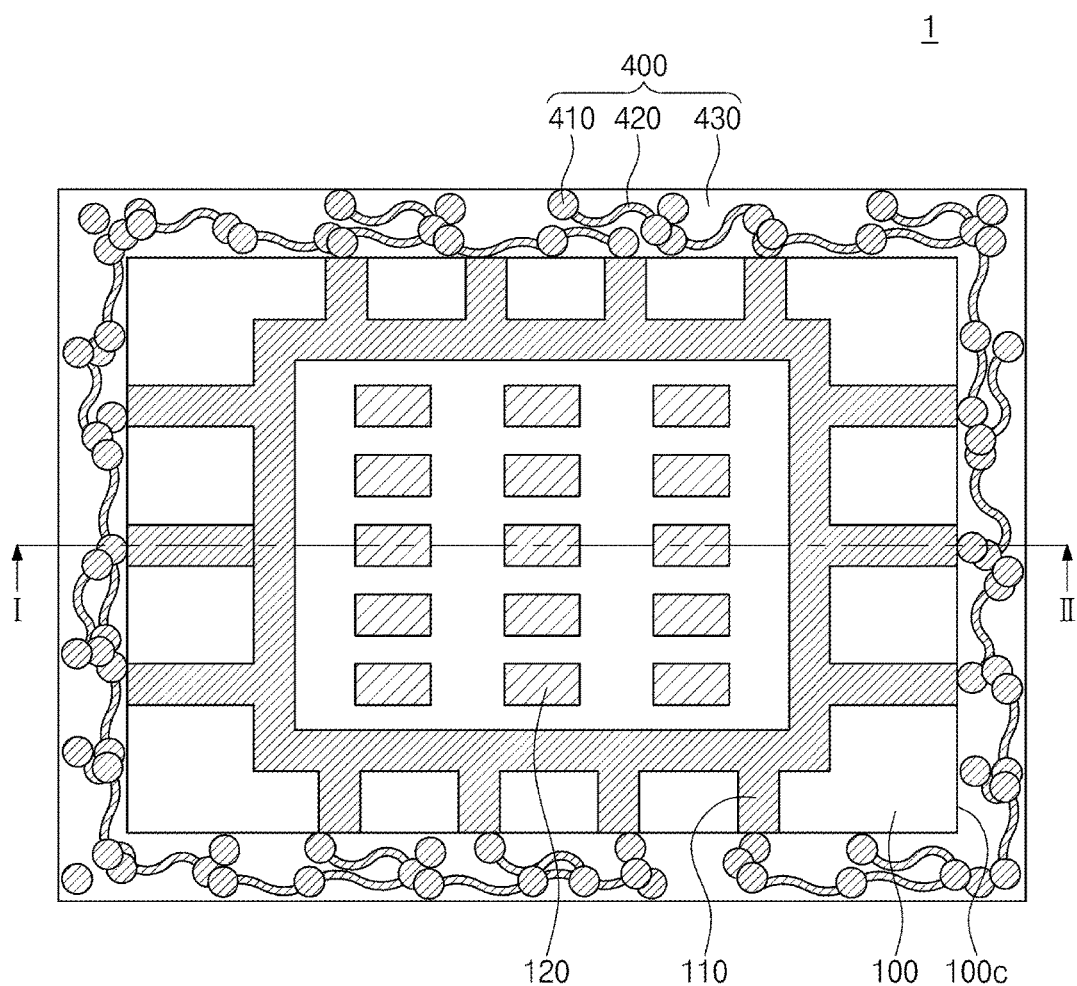
FIG. 1A is a plan view illustrating a semiconductor package according to an example embodiment.
Figure 1B:
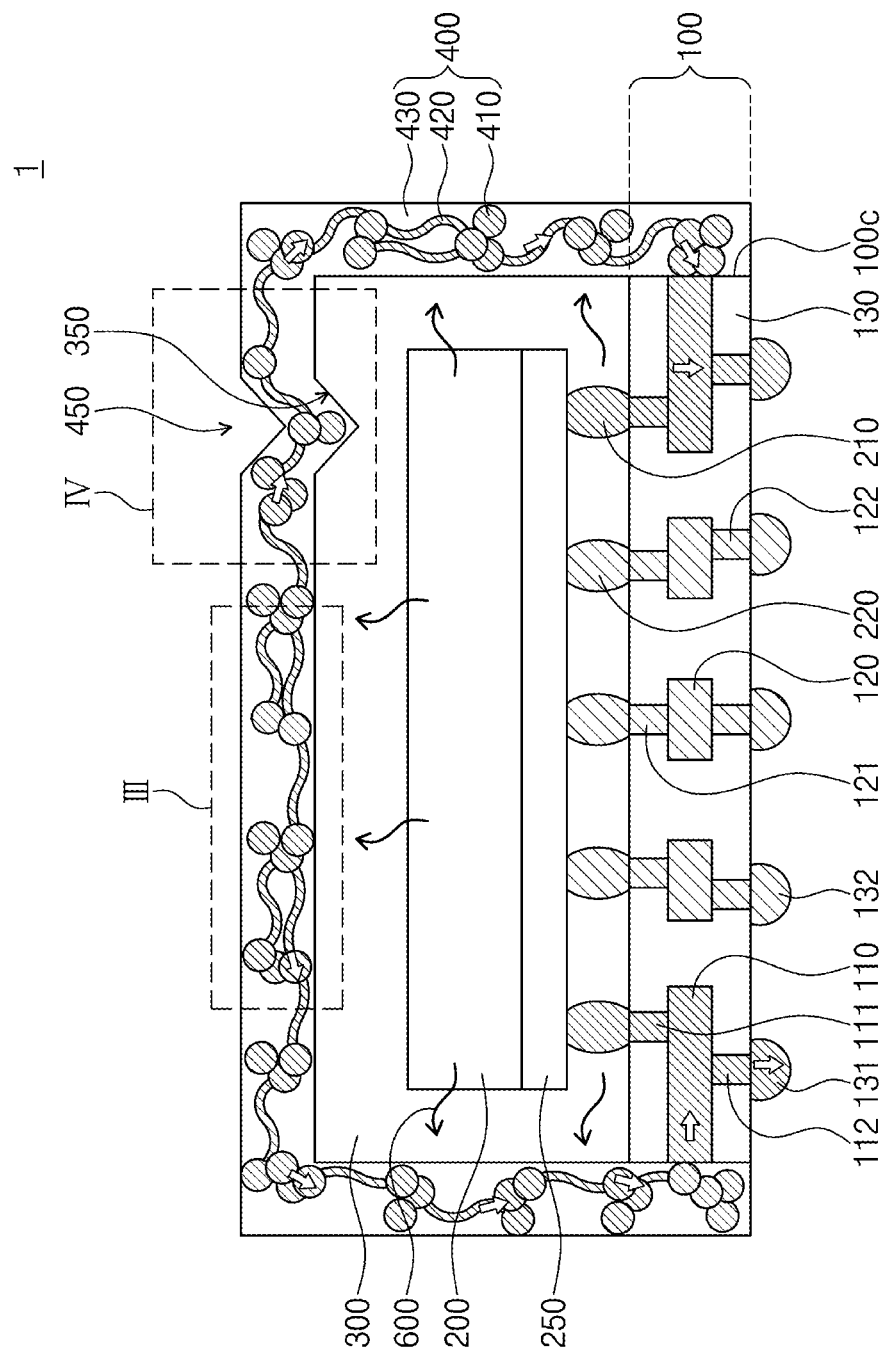
FIG. 1B is a cross-sectional view taken along a line I-II of FIG. 1A.

FIG. 1A is a plan view illustrating a semiconductor package according to an example embodiment. FIG. 1B is a cross-sectional view taken along a line I-II of FIG. 1A.

Referring to FIGS. 1A and 1B, a semiconductor package 1 may include a substrate 100, a semiconductor chip 200, a molding layer 300, and a shielding layer 400. The substrate 100 may be a printed circuit board (PCB), a silicon substrate, a redistribution substrate, or a flexible substrate. The substrate 100 may include an insulating layer 130, a ground pattern structure, a signal structure, and terminals. The ground structure may include a ground pattern 110, an upper ground via 111, and a lower ground via 112. The signal structure may include a signal pattern 120, an upper signal via 121, and a lower signal via 122. The terminals may include a ground terminal 131 and a signal terminal 132. The ground terminal 131 and the signal terminal 132 may be disposed on a bottom surface of the insulating layer 130 and may include a conductive material and may have solder ball shapes. The ground terminal 131 may be insulated from the signal terminal 132.

The insulating layer 130 may include a plurality of layers. The ground pattern 110 may be provided in the insulating layer 130. The ground pattern 110 may include a conductive material such as a metal. The ground pattern 110 may be disposed in an edge portion of the substrate 100 when viewed from a plan view. The ground pattern 110 may be exposed at a sidewall 100c of the substrate 100. The lower ground via 112 may be disposed between the ground pattern 110 and the ground terminal 131 in the insulating layer 130. The ground pattern 110 may be electrically connected to the ground terminal 131 through the lower ground via 112. In the present specification, it will be understood that when an element is referred to as being "electrically connected" to another element, it may be directly connected to the other element or intervening elements may be present. The upper ground via 111 may be provided on the ground pattern 110 and may be connected to the ground pattern 110. The upper ground via 111 may not be aligned with the lower ground via 112 in a vertical direction. Here, the vertical direction may be a direction vertical to a top surface of the substrate 100. The numbers of the lower ground via 112, the ground pattern 110 and the upper ground via 111 are not limited to those illustrated in FIGS. 1A and 1B.

The signal pattern 120 may be disposed in a central portion of the substrate 100 when viewed from a plan view. The signal pattern 120 may be spaced apart from the sidewall 100c of the substrate 100. The signal pattern 120 may include a conductive material such as a metal. The signal pattern 120 may be insulated from the ground pattern 110. The signal pattern 120 may be electrically connected to the signal terminal 132 through the lower signal via 122.

The semiconductor chip 200 may be mounted on the top surface of the substrate 100. The semiconductor chip 200 may include an integrated circuit layer 250 disposed on a bottom surface thereof. Interposers may be provided between the substrate 100 and the semiconductor chip 200 and may include a conductive material (e.g., a metal) and may have solder ball shapes, bump shapes, or pillar shapes. The interposers may include a ground interposer 210 and a signal interposer 220. The ground interposer 210 may be connected to the upper ground via 111. The integrated circuit layer 250 of the semiconductor chip 200 may be grounded through the ground interposer 210, the upper ground via 111, the ground pattern 110, the lower ground via 112, and the ground terminal 131. The signal interposer 220 may be connected to the upper signal via 121. When the semiconductor chip 200 is operated, an electrical signal generated from the integrated circuit layer 250 may be transmitted to an external system through the signal interposer 220, the upper signal via 121, the signal pattern 120, the lower signal via 122, and the signal terminal 132. Likewise, an external electrical signal may be transmitted to the integrated circuit layer 250 through the signal pattern 120. In certain embodiments, the ground and signal interposers 210 and 220 may include bonding wires provided on the top surface of the substrate 100 and may be electrically connected to the substrate 100.

The molding layer 300 may be provided on the substrate 100 and may cover the semiconductor chip 200. The molding layer 300 may extend into a gap between the substrate 100 and the semiconductor chip 200. Alternatively, an underfill layer may fill the gap between the substrate 100 and the semiconductor chip 200. The molding layer 300 may include an insulating polymer material such as an epoxy molding compound (EMC). In some embodiments, a hydrophilic functional group may be provided on a top surface and a sidewall of the molding layer 300. A recess 350 may be provided on the top surface of the molding layer 300. Unlike FIG. 1B, the recess 350 may be provided on the sidewall of the molding layer 300.

The shielding layer 400 may be provided on the top surface of the molding layer 300, the sidewall of the molding layer 300, and the sidewall 100c of the substrate 100. The shielding layer 400 may surround the molding layer 300. Since the shielding layer 400 has conductivity, the shielding layer 400 may block electromagnetic interference (EMI). The electromagnetic interference (EMI) means that electromagnetic waves irradiated or transmitted from an electronic element interfere with signal reception/transmission of another electronic element. According to some embodiments, since the semiconductor package 1 includes the shielding layer 400, the semiconductor package 1 may not disturb an operation of another electronic device (e.g., a transmitter or a receiver). The shielding layer 400 may absorb electromagnetic waves 600 generated by the integrated circuit layer 250 of the semiconductor chip 200, the ground and signal interposers 210 and 220, or the substrate 100. The ground pattern 110 may be exposed at the sidewall 100c of the substrate 100, and thus the shielding layer 400 may be electrically connected to the ground pattern 110. The electromagnetic waves 600 absorbed in the shielding layer 400 may be transmitted to the outside of the semiconductor package 1 through the ground pattern 110 and the ground terminal 131, like an arrow illustrated in FIG. 1B. The signal pattern 120 may not be exposed at the sidewall 100c of the substrate 100, and thus the shielding layer 400 may not be electrically connected to the signal pattern 120. Hereinafter, the shielding layer 400 will be described in more detail.

Figure 1C:
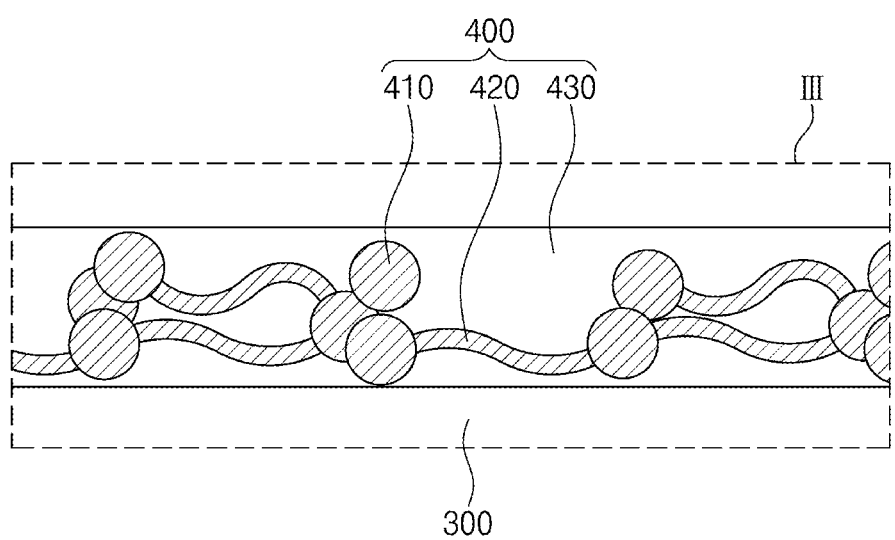
FIG. 1C is an enlarged view of a region III of FIG. 1B.

FIG. 1C is an enlarged view of a region III of FIG. 1B.

Referring to FIGS. 1B and 1C, the shielding layer 400 may include metal particles 410, a conductive carbon material 420, and a polymer 430. The shielding layer 400 may have conductivity provided by the metal particles 410 and the conductive carbon material 420 included therein. In some embodiments, the metal particles 410 may include silver (Ag). In certain embodiments, the metal particles 410 may include gold (Au), copper (Cu), nickel (Ni), iron (Fe), aluminum (Al), or any combination thereof. When the metal particles 410 are spaced apart from each other, electrons may slowly move between the metal particles 410 or may have difficultly moving between the metal particles 410. According to some embodiments, the metal particles 410 may agglomerate together so as to be physically connected to each other. Thus, electrons may move quickly between the metal particles 410. As a result, a resistance of the shielding layer 400 may be reduced. As the resistance of the shielding layer 400 is reduced, the electromagnetic waves adsorbed in the shielding layer 400 may be quickly transmitted to the exterior of the semiconductor package 1. For the purpose of ease and convenience in explanation and illustration, an interface surface is illustrated between the metal particles 410 in FIGS. 1B and 1C. However, embodiments are not limited thereto. In certain embodiments, unlike FIGS. 1B and 1C, the metal particles 410 may be connected to each other, and thus an interface surface between the metal particles 410 may not be distinguished or shown. A content of the metal particles 410 may range from 40 wt % to 60 wt % in the shielding layer 400. If the content of the metal particles 410 is lower than 40 wt % in the shielding layer 400, the shielding layer 400 may not sufficiently prevent the electromagnetic interference of the semiconductor package 1. If the content of the metal particles 410 is higher than 60 wt % in the shielding layer 400, a weight or manufacture cost of the shielding layer 400 may be increased.

The conductive carbon material 420 may be physically and electrically connected to the metal particles 410. Even though the metal particles 410 are spaced apart from each other, the metal particles 410 may be electrically connected to each other through the conductive carbon material 420. Since an electrical conductivity of the conductive carbon material 420 is lower than an electrical conductivity of the metal particles 410, the resistance of the shielding layer 400 may be further reduced by the conductive carbon material 420. The conductive carbon material 420 may be covalently bonded to the metal particles 410. A resistance between the conductive carbon material 420 and the metal particles 410 may be further reduced by the covalent bond. As a result, the resistance of the shielding layer 400 may be further reduced. A content of the conductive carbon material 420 may be 0.5 wt % or more in the shielding layer 400 and, more particularly, may range from 0.5 wt % to 3 wt % in the shielding layer 400. If the content of the conductive carbon material 420 is lower than 0.5 wt % in the shielding layer 400, the resistance of the shielding layer 400 may be increased. If the content of the conductive carbon material 420 is higher than 3 wt % in the shielding layer 400, the content of the metal particles 410 in the shielding layer 400 may be reduced.

An intensity of interaction between the conductive carbon material 420 and the metal particle 410 covalently bonded to each other may be greater than an intensity of interaction between the conductive carbon material 420 and the metal particle 410 which are in contact with each other without the covalent bond. An affinity between the conductive carbon material 420 and an external material and an affinity between the metal particles 410 and the external material may decrease as the intensity of the interaction (e.g., bonding strength) between the conductive carbon material 420 and the metal particles 410 increases. For example, the external material may be a hydrophilic material, and the shielding layer 400 may have a hydrophobic property. The shielding layer 400 may have a contact angle of 80 degrees to 110 degrees. In particular, the shielding layer 400 may have the contact angle of 90 degrees to 110 degrees. Thus, the shielding layer 400 may not be contaminated by the external material.

The conductive carbon material 420 may have high thermal conductivity. The thermal conductivity of the conductive carbon material 420 may be higher than thermal conductivities of the molding layer 300 and the metal particles 410. For example, the conductive carbon material 420 may have the thermal conductivity of about 3000 W/mK. The metal particles 410 may have the thermal conductivity of about 350 W/mK to about 500 W/mK. The molding layer 300 may have the thermal conductivity of about 0.88 W/mK. Since the shielding layer 400 includes the conductive carbon material 420, heat generated from the semiconductor chip 200 may be released quickly to the outside of the semiconductor package 1 when the semiconductor package 1 is operated. If the content of the conductive carbon material 420 is lower than 0.5 wt % in the shielding layer 400, the heat of the semiconductor chip 200 may be more slowly released to the outside of the semiconductor package 1. In this case, reliability of an operation of the semiconductor chip 200 may be deteriorated. In some embodiments, the conductive carbon material 420 may include a carbon nanotube (e.g., a multi-layered carbon nanotube). In certain embodiments, the conductive carbon material 420 may include graphite, carbon black, or carbon fiber.

The polymer 430 may include a hydrophilic polymer. For example, the polymer 430 may include at least one of an epoxy-based polymer or polyurethane. However, embodiments are not limited thereto. In certain embodiments, the polymer 430 may include at least one of other various kinds of hydrophilic polymers. The polymer 430 may be provided in a gap between the conductive carbon material 420 and the metal particles 410. The polymer 430 may act as a binder. For example, the metal particles 410 and the conductive carbon material 420 may be adhered to the molding layer 300 by the polymer 430. The hydrophilic functional group may be provided on the molding layer 300, and thus bonding strength between the polymer 430 and the molding layer 300 may be more increased. Thus, the shielding layer 400 may be more strongly adhered to the molding layer 300.

As illustrated in FIG. 1B, a mark 450 may be provided on the semiconductor package 1. The mark 450 may be a portion of the shielding layer 400, which is provided on the recess 350 of the molding layer 300. Hereinafter, the mark 450 of the semiconductor package 1 will be described in more detail.

Figure 1D:
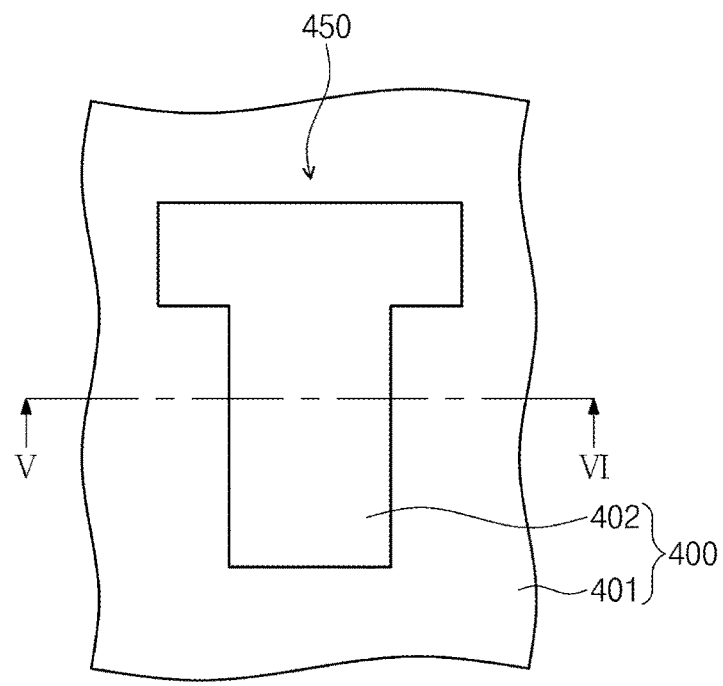
FIG. 1D is an enlarged plan view illustrating a top surface of a shielding layer according to an example embodiment.
Figure 1E:
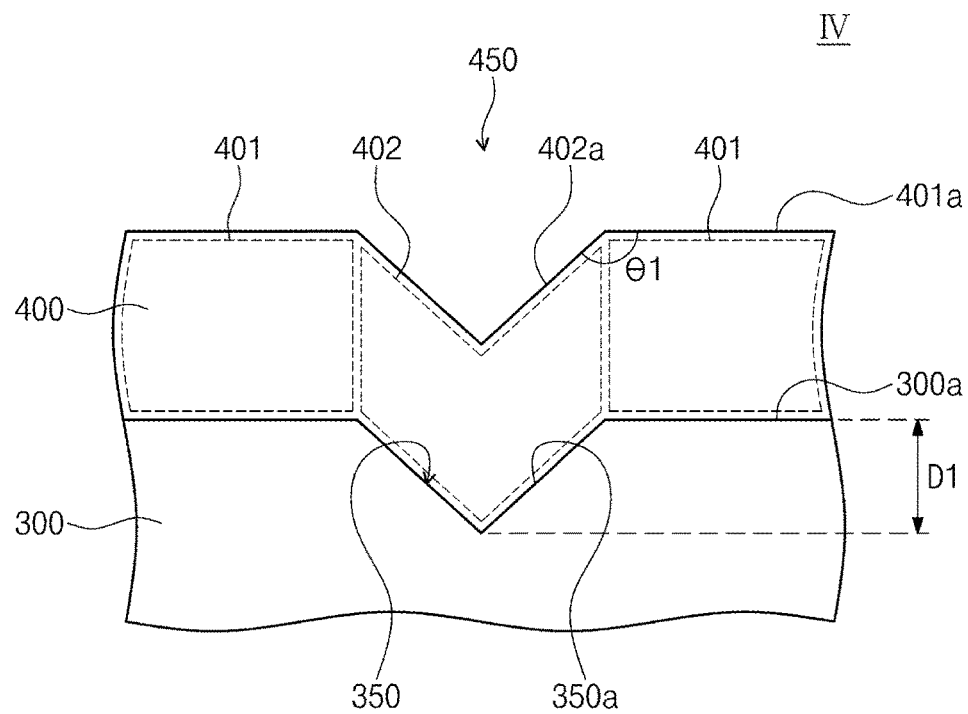
FIG. 1E is an enlarged view of a region IV of FIG. 1B.

FIG. 1D is an enlarged plan view illustrating a top surface of a shielding layer according to an example embodiment. FIG. 1E is an enlarged cross-sectional view of a region IV of FIG. 1B and corresponds to a cross-sectional view taken along a line V-VI of FIG. 1D. Hereinafter, the descriptions to the same technical features as mentioned above will be omitted or mentioned briefly for the purpose of ease and convenience in explanation.

Referring to FIGS. 1B, 1D, and 1E, the recess 350 may be provided on the top surface 300a of the molding layer 300. The recess 350 may have inclined sidewalls 350a. The inclined sidewalls 350a may be inclined with respect to the top surface 300a of the molding layer 300. The term "inclined" may be determined depending on an average gradient between both ends of an element. In FIGS. 1D and 1E, the top surface 300a of the molding layer 300 is defined as a top surface of a portion, in which the recess 350 is not formed, of the molding layer 300. The recess 350 may have a V-shaped cross section. For example, the inclined sidewalls 350a of the recess 350 may meet each other. Alternatively, in certain embodiments, the recess 350 may have a U-shaped cross section. A depth D1 of the recess 350 may be 20 μm or more. In particular, the depth D1 of the recess 350 may be 25 μm or more. In the present specification, the depth D1 of the recess 350 may mean a vertical depth from the top surface 300a of the molding layer 300 to a bottom end of the recess 350. The depth D1 of the recess 350 may be smaller than a distance between the top surface 300a of the molding layer 300 and the semiconductor chip 200, and thus the semiconductor chip 200 may not be exposed.

The shielding layer 400 may be provided on the molding layer 300 and may extend into the recess 350. The shielding layer 400 may conformally cover the inclined sidewalls 350a of the recess 350 and the top surface 300a of the molding layer 300 so that a top surface of the shielding layer 400 is recessed where the shielding layer 400 covers the recess 350. The shielding layer 400 may include a first portion 401 and a second portion 402. The first portion 401 may be provided on the top surface 300a of the molding layer 300 outside the recess 350. The second portion 402 may be provided on the recess 350. The second portion 402 may extend from the first portion 401. A material of the second portion 402 may be the same as a material of the first portion 401. A first composition ratio of the first portion 401 of the shielding layer 400 may be the substantially same as a second composition ratio of the second portion 402 of the shielding layer 400. The term "substantially equal" may include a tolerance that may occur during a process. The first portion 401 and the second portion 402 of the shielding layer 400 may have a first top surface 401a and a second top surface 402a, respectively. The second portion 402 of the shielding layer 400 may have a cross section corresponding to the cross section of the recess 350. In some embodiments, the second portion 402 of the shielding layer 400 may have a V-shaped cross section. Alternatively, in certain embodiments, the second portion 402 of the shielding layer 400 may have a U-shaped cross section.

The second top surface 402a of the shielding layer 400 may be inclined with respect to the first top surface 401a of the shielding layer 400. An angle θ1 between the second top surface 402a and the first top surface 401a of the shielding layer 400 may range from about 130 degrees to about 160 degrees.

Since the second top surface 402a of the shielding layer 400 is inclined with respect to the first top surface 401a of the shielding layer 400, a reflection angle of light reflected from the second portion 402 of the shielding layer 400 may be different from a reflection angle of light reflected from the first portion 401 of the shielding layer 400 when light is incident on the first and second top surfaces 401a and 402a in the same direction. As a result, an intensity of the light (second intensity of the light) reflected from the second portion 402 of the shielding layer 400 may be different from an intensity of the light (a first intensity of the light) reflected from the first portion 401 of the shielding layer 400. For example, the intensity of the light reflected from the first portion 401 of the shielding layer 400 may be weaker than the intensity of the light reflected from the second portion 402 of the shielding layer 400. Here, the intensity of light may mean the amount of received light per unit area during unit time and may be a value measured vertically to a direction in which light travels. A difference in brightness between the first and second portions 401 and 402 of the shielding layer 400 may increase as a difference in intensity between the reflected light of the first portion 401 and the reflected light of the second portion 402 increases. When the depth D1 of the recess 350 is 20 μm or more (in particular, 25 μm or more) and the angle θ1 between the first and second top surfaces 401a and 402a is in the range of 130 degrees to 160 degrees, the intensity of the light reflected from the first portion 401 may be sufficiently different from the intensity of the light reflected from the second portion 402. Thus, the brightness of the second portion 402 of the shielding layer 400 may be clearly distinguished from the brightness of the first portion 401 of the shielding layer 400. In other words, the second portion 402 of the shielding layer 400 may have visibility by the difference in brightness between the first and second portions 401 and 402. For example, the first portion 401 of the shielding layer 400 may have ash color, and the second portion 402 of the shielding layer 400 may have black color. Thus, the second portion 402 of the shielding layer 400 may function as the mark 450, and the mark 450 may have visibility. In the present specification, the visibility may mean visibility of color, and the color may include hue or brightness. A planar shape of the mark 450 may not be limited to the shape illustrated in FIG. 1D but may be variously modified. Unlike FIG. 1B, the recess 350 and the mark 450 may be provided on the sidewall of the molding layer 300.

Figure 2A:
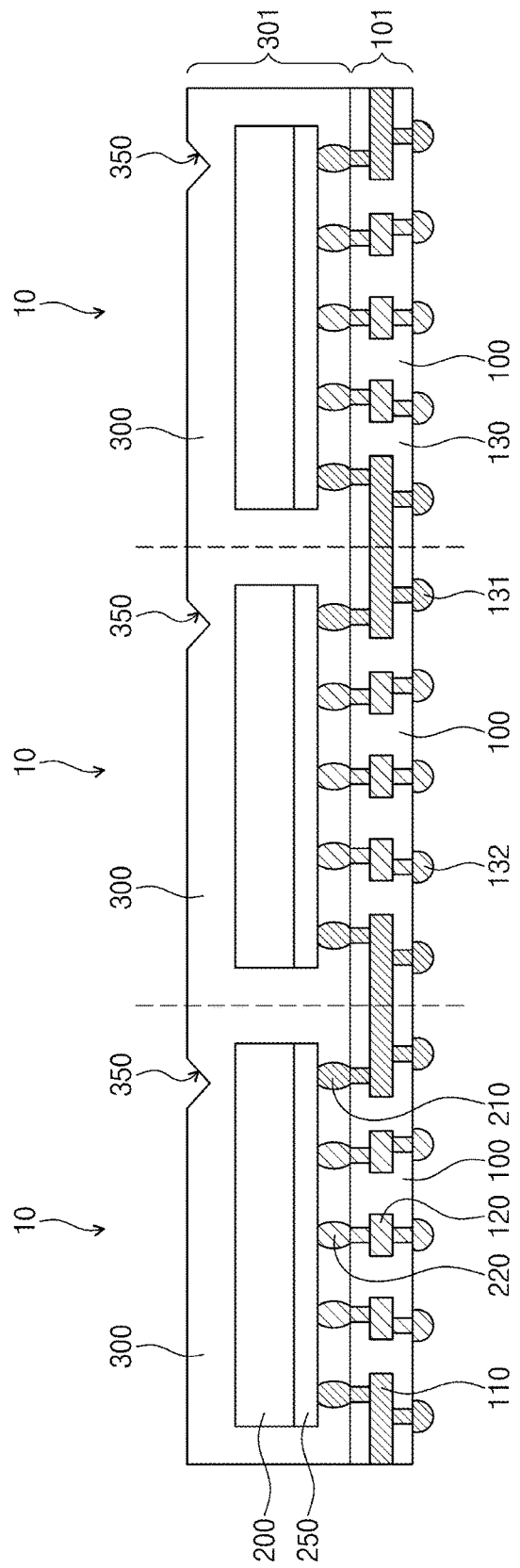
Figure 2B:
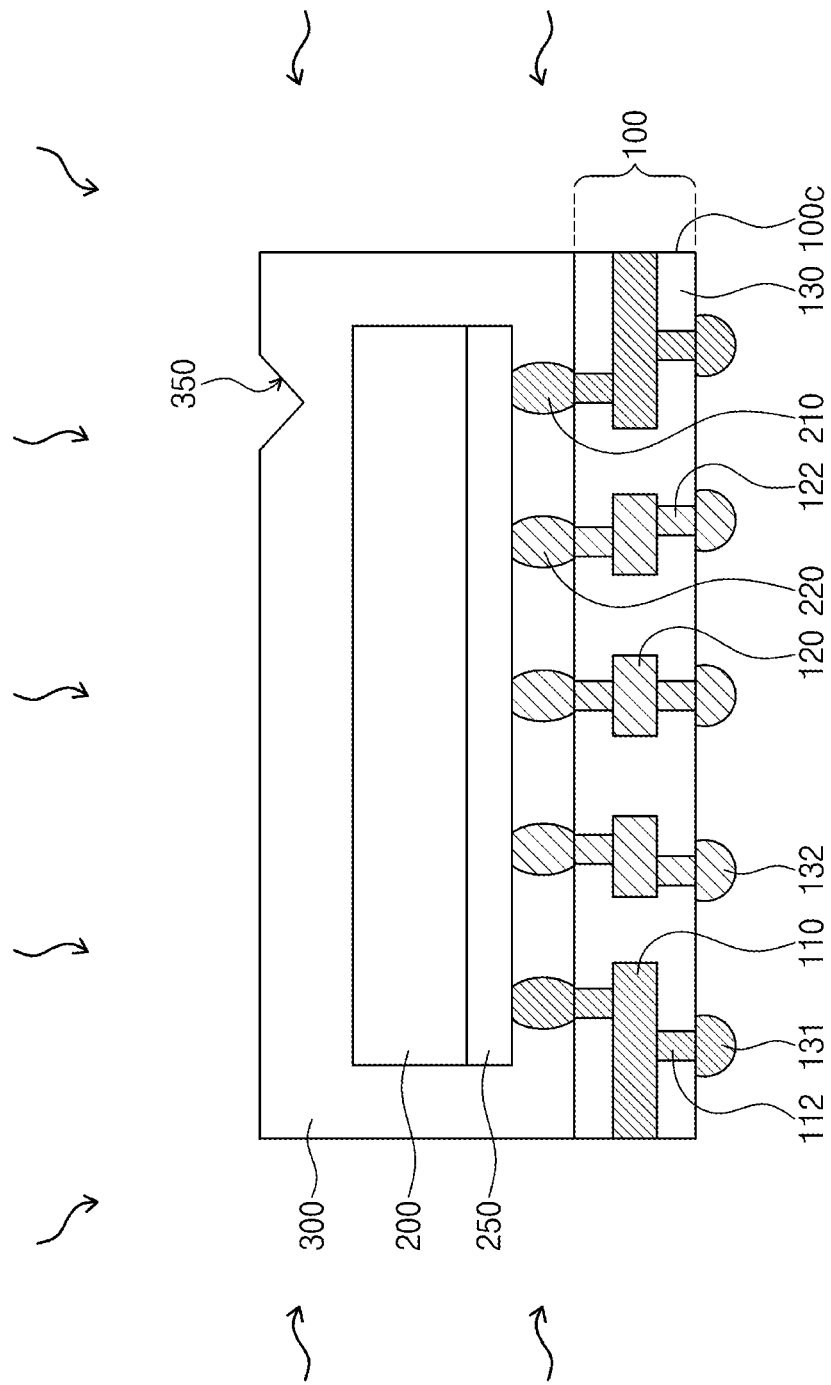
Figure 2D:
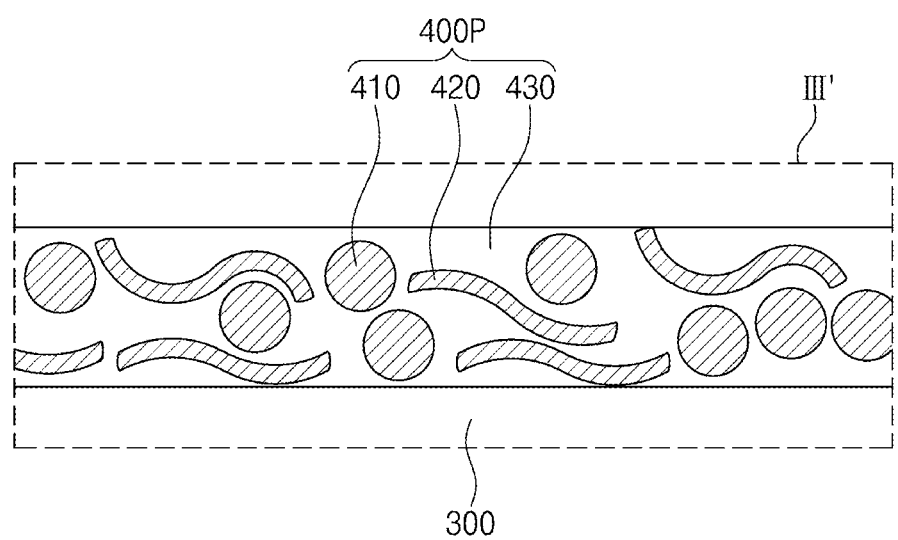
FIG. 2D is an enlarged view of a region III' of FIG. 2C.

FIGS. 2A to 2C are cross-sectional views illustrating a method for manufacturing a semiconductor package according to an example embodiment. FIG. 2D is an enlarged view of a region III' of FIG. 2C. Hereinafter, the descriptions to the same technical features as mentioned above will be omitted or mentioned briefly for the purpose of ease and convenience in explanation.

Referring to FIG. 2A, a semiconductor chip 200 may be mounted on a package substrate 101. The package substrate 101 may be a wafer-level substrate. The semiconductor chip 200 may be provided in plurality on the package substrate 101. A molding pattern 301 may be formed on the package substrate 101 to cover the semiconductor chips 200. Laser may be irradiated onto the molding pattern 301 to form a recess 350. The laser may be infrared laser. A depth of the recess 350 may be 20 μm or more. Multiple recesses 350 may be formed in in the molding pattern 301. The ground and signal terminals 131 and 132 may be formed on a bottom surface of the package substrate 101. Thereafter, the molding pattern 301 and the package substrate 101 may be sawed along an alternated long and short dash line illustrated in FIG. 2A, thereby forming a plurality of unit packages 10. The package substrate 101 may be divided into substrates 100 by the sawing process, and the molding pattern 301 may be divided into molding layers 300 by the sawing process. The unit packages 10 may include the substrates 100, the semiconductor chips 200, and the molding layers 300. Hereinafter, processes performed on each of the unit packages 10 will be described in detail.

Referring to FIG. 2B, a top surface and a sidewall of the molding layer 300 may be treated by plasma. The plasma treatment process may be performed using oxygen plasma and/or argon plasma. Thus, a hydrophilic functional group may be formed on the top surface and the sidewall of the molding layer 300. For example, the hydrophilic functional group may include a hydroxyl group (—OH). The plasma treatment process may further be performed on a sidewall 100c of the substrate 100. In some embodiments, a surface roughness of the top surface and the sidewall of the molding layer 300 may be increased by the plasma treatment process.

Referring to FIGS. 2C and 2D, a coating solution may be applied to the top surface of the molding layer 300, the sidewall of the molding layer 300, and the sidewall 100c of the substrate 100 to form a preliminary shielding layer 400P. The preliminary shielding layer 400P may be in physical contact with the ground pattern 110 of the substrate 100. The preliminary shielding layer 400P may extend onto the recess 350. The coating solution may include metal particles 410, a conductive carbon material 420, a polymer 430, and a solvent. Kinds of the metal particles 410, the conductive carbon material 420 and the polymer 430 may be the same as described with reference to FIGS. 1A and 1B. The metal particles 410 may have an average diameter of about 50 nm. The polymer 430 may be a hydrophilic polymer. The conductive carbon material 420 may have a hydrophile property. The solvent may include at least one of propylene glycol methyl ether acetate (PGMEA), water, and ethanol. The solvent may have a hydrophile property. Thus, the conductive carbon material 420 may be uniformly dispersed in the solvent. The coating solution may be applied onto the molding layer 300 by a spray coating method.

The preliminary shielding layer 400P may include the same material as the coating solution. As illustrated in FIG.

2D, the conductive carbon material 420 may not be bonded to the metal particles 410. The metal particles 410 may not be in physical contact with each other. Since the coating solution has the hydrophile property, the preliminary shielding layer 400P may have the hydrophile property. The preliminary shielding layer 400P may interact with the hydrophilic functional group which is formed on the molding layer 300 by the plasma treatment process of FIG. 2B. Thus, the preliminary shielding layer 400P may be well adhered to the molding layer 300.

The preliminary shielding layer 400P (e.g., the polymer of the preliminary shielding layer 400P) may be hardened. The preliminary shielding layer 400P may be hardened under a condition of 90 degrees Celsius to 190 degrees Celsius. The solvent may be volatilized in the process of hardening the preliminary shielding layer 400P.

Referring to FIGS. 1B and 1C, the preliminary shielding layer 400P may be thermally treated to form a shielding layer 400. The thermal treatment process of the preliminary shielding layer 400P may be performed at about 150 degrees Celsius or more, e.g., at a temperature of 150 degrees Celsius to 300 degrees Celsius. In some embodiments, the thermal treatment process of the preliminary shielding layer 400P may be performed by an infrared reflow process using an infrared heater. In certain embodiments, the preliminary shielding layer 400P may be thermally treated using plasma or a high-temperature nitrogen gas. In certain embodiments, the preliminary shielding layer 400P may be thermally treated using a halogen lamp under vacuum.

The metal particles 410 may agglomerate together by the thermal treatment process so as to be physically connected to each other. The conductive carbon material 420 may be bonded (e.g., covalently bonded) to the metal particles 410. Thus, the resistance of the shielding layer 400 may be reduced. If the preliminary shielding layer 400P is thermally treated at a temperature lower than 150 degrees Celsius, the metal particles 410 may not be sufficiently connected to each other or the conductive carbon material 420 may not be bonded to the metal particles 410. If the preliminary shielding layer 400P is thermally treated at a temperature higher than 300 degrees Celsius, the molding layer 300 may be damaged.

Since the conductive carbon material 420 is covalently bonded to the metal particles 410 in the shielding layer 400, the shielding layer 400 may have a hydrophobic property as compared with the preliminary shielding layer 400P of FIG. 2D. A contact angle of water with respect to the shielding layer 400 may be greater than a contact angle of water with respect to the preliminary shielding layer 400P. For example, the contact angle of water with respect to the shielding layer 400 may be greater than 90 degrees, the contact angle of water with respect to the preliminary shielding layer 400P may be smaller than 90 degrees.

As described with reference to FIGS. 1D and 1E, the angle θ1 between the first and second top surfaces 401a and 402a of the shielding layer 400 may range from about 130 degrees to about 160 degrees. Thus, the mark 450 having visibility may be formed on the semiconductor package 1 without an additional painting process.

Figure 3A:
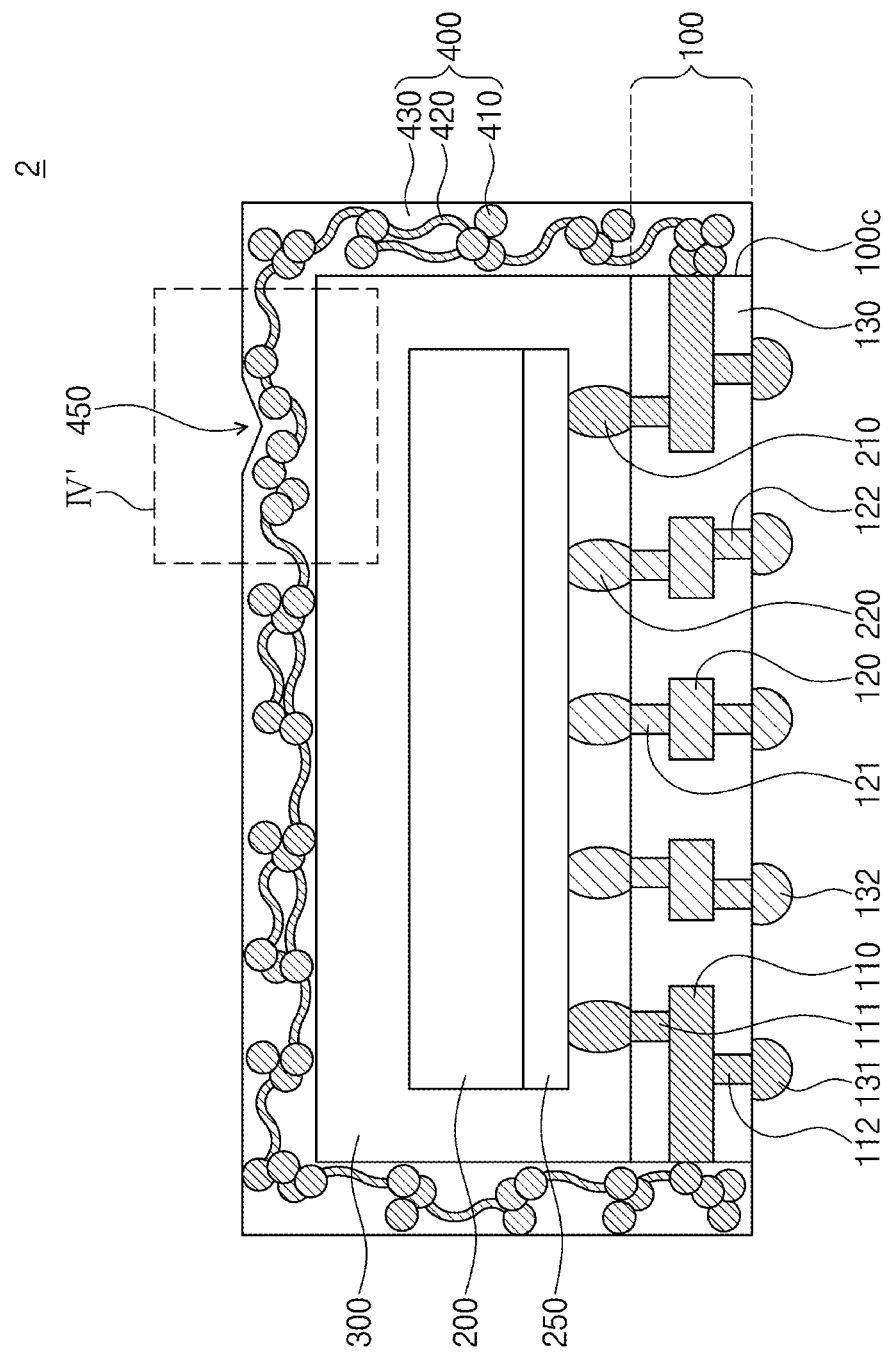
FIG. 3A is a cross-sectional view illustrating a semiconductor package according to an example embodiment.
Figure 3B:
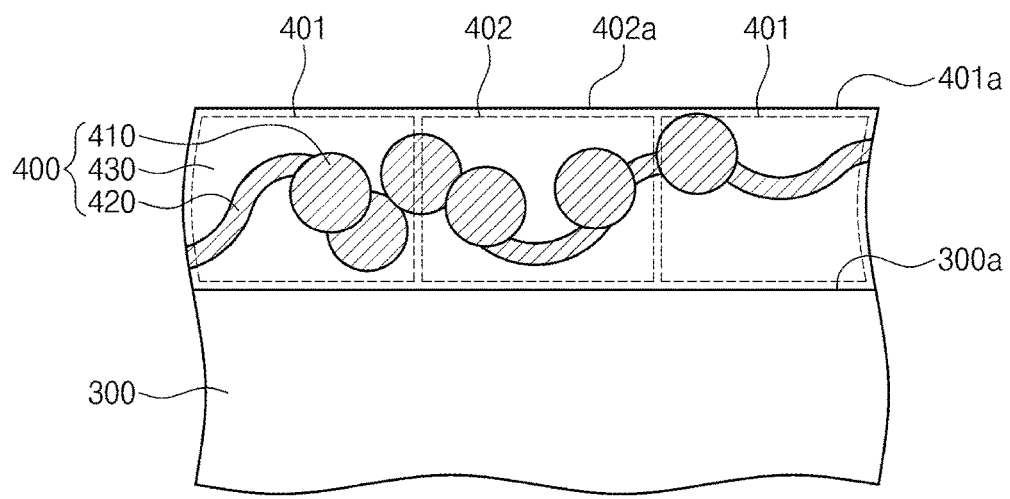
FIGS. 3B and 3C are enlarged cross-sectional views illustrating a method for forming a mark of a semiconductor package according to example embodiments.
Figure 3C:
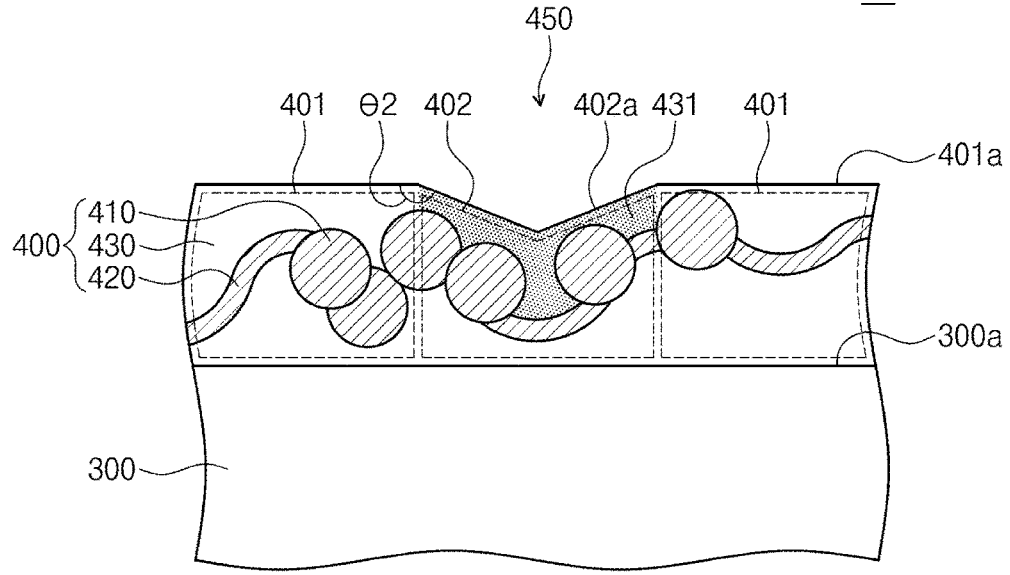

FIG. 3A is a cross-sectional view corresponding to the line I-II of FIG. 1A to illustrate a semiconductor package according to an example embodiment. FIGS. 3B and 3C are enlarged cross-sectional views corresponding to a region IV' of FIG. 3A to illustrate a method for forming a mark of a semiconductor package according to an example embodiment. Hereinafter, the descriptions to the same technical features as mentioned above will be omitted or mentioned briefly for the purpose of ease and convenience in explanation.

Referring to FIGS. 3A and 3B, a semiconductor package 2 may include a substrate 100, a semiconductor chip 200, a molding layer 300, and a shielding layer 400. The substrate 100, the semiconductor chip 200, and the molding layer 300 may be formed by the same method as described with reference to FIG. 2A. However, unlike FIG. 2A, the recess 350 may not be formed on the molding layer 300. The shielding layer 400 may be formed on the molding layer 300. The shielding layer 400 may be formed by the same method as described with reference to FIGS. 2B to 2D. Here, the coating solution may further include titanium oxide, and thus the shielding layer 400 may include the metal particles 410, the conductive carbon material 420, the polymer 430, and titanium oxide (TiO2). The shielding layer 400 may include a first portion 401 and a second portion 402. A first top surface 401a of the first portion 401 of the shielding layer 400 may be substantially parallel to a second top surface 402a of the second portion 402 of the shielding layer 400.

Referring to FIGS. 3A and 3C, light may be irradiated onto the second portion 402 of the shielding layer 400. The first portion 401 of the shielding layer 400 may not be exposed to the light. For example, the light may have a wavelength of a green region, e.g., a wavelength of 495 nm to 570 nm. The light may be irradiated using a laser apparatus. The laser apparatus may have an output power of, but not limited to, 4 W to 6 W. The titanium oxide may act as a photocatalyst. When the light is irradiated, the titanium oxide may react with the polymer 430 to form a modified polymer 431 which is recessed in the second portion 402. The modified polymer 431 may be formed in an upper portion of the second portion 402 of the shielding layer 400. Thus, a second wavelength of light reflected from the second portion 402 of the shielding layer 400 may be different from a first wavelength of light reflected from the first portion 401 of the shielding layer 400, and thus a hue of the second portion 402 may be different from a hue of the first portion 401. At this time, the hue of the second portion 402 may be different from the hue of the first portion 401 in such a way that the hue of the second portion 402 is sufficiently distinguished from the hue of the first portion 401. For example, the first portion 401 of the shielding layer 400 may have ash color, and the second portion 402 of the shielding layer 400 may have brown color. As a result, the second portion 402 of the shielding layer 400 may function as a mark 450, and the mark 450 can have visibility.

When the light is irradiated, the second portion 402 of the shielding layer 400 may be recessed. Thus, the second top surface 402a of the second portion 402 of the shielding layer 400 may be inclined with respect to the first top surface 401a of the first portion 401 of the shielding layer 400. However, an angle θ2 between the first and second top surfaces 401a and 402a of the shielding layer 400 may not be limited to the range of the angle θ1 described with reference to FIGS. 1D and 1E. The angle θ2 between the first and second top surfaces 401a and 402a of the shielding layer 400 may be greater than 0 degree. Thus, a brightness of the second portion 402 of the shielding layer 400 may be different from a brightness of the first portion 401 of the shielding layer 400.

Figure 3D:
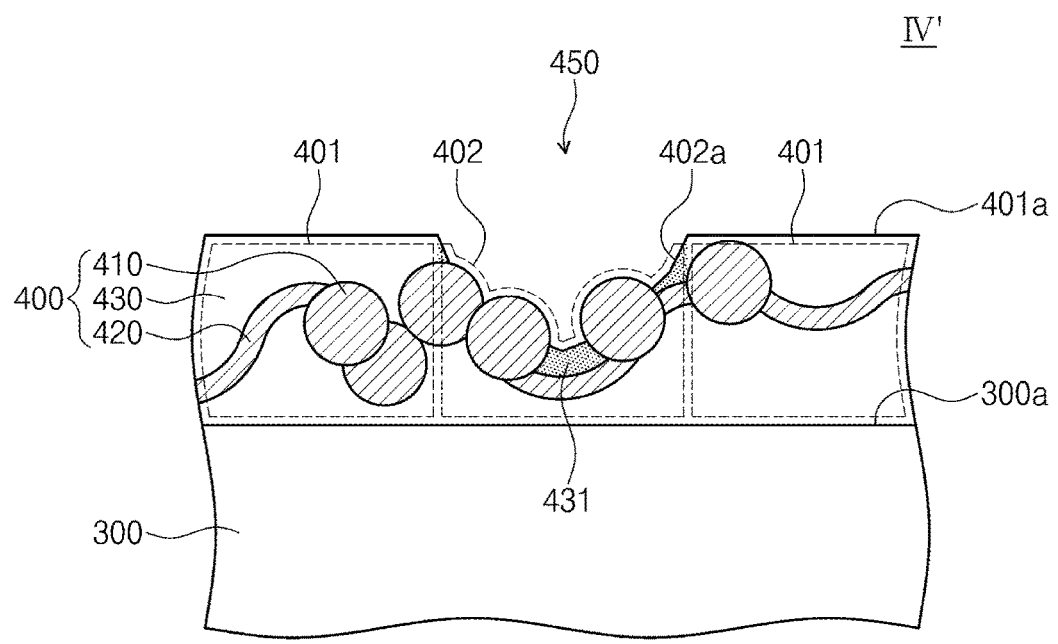
FIG. 3D is an enlarged cross-sectional view illustrating a method for forming a mark of a semiconductor package according to an example embodiment.

FIG. 3D is an enlarged cross-sectional view corresponding to the region IV' of FIG. 3A to illustrate a method for forming a mark of a semiconductor package according to an example embodiment. Hereinafter, the descriptions to the same technical features as mentioned above will be omitted or mentioned briefly for the purpose of ease and convenience in explanation.

Referring to FIGS. 3A and 3D, light may be irradiated onto the second portion 402 of the shielding layer 400. For example, the irradiation of the light may be performed by the substantially same method as described with reference to FIG. 3B. For example, the light may have a wavelength of a green region, e.g., a wavelength of 495 nm to 570 nm. Thus, the modified polymer 431 may be formed in the upper portion of the second portion 402, as described with reference to FIG. 3B. When the light is excessively irradiated, the polymer 430 or the modified polymer 431 may be removed from the second portion 402 of the shielding layer 400 to expose the metal particles 410 at a second top surface 402a of the shielding layer 400. In this case, the second portion 402 of the shielding layer 400 may show the color (e.g., silver color) of the metal particles 410.

The first portion 401 of the shielding layer 400 may not be exposed to the light. The metal particles 410 may not be exposed at the first top surface 401a of the shielding layer 400, or a density of the metal particles 410 exposed at the first top surface 401a may be less than a density of the metal particles 410 exposed at the second top surface 402a. Thus, the color of the second portion 402 may be different from the color of the first portion 401. The first portion 401 of the shielding layer 400 may have ash color. As a result, the second portion 402 of the shielding layer 400 may function as a mark 450, and the mark 450 can have visibility.

Figure 4B:
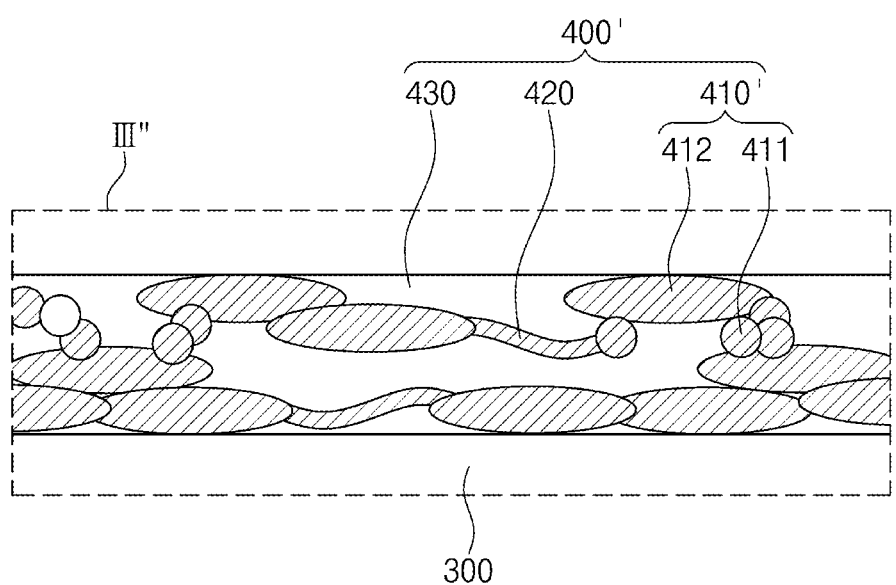
FIG. 4B is an enlarged view of a region III" of FIG. 4A.

FIG. 4A is a cross-sectional view corresponding to the line I-II of FIG. 1A to illustrate a semiconductor package according to an example embodiment. FIG. 4B is an enlarged view of a region III" of FIG. 4A. Hereinafter, the descriptions to the same components as mentioned above will be omitted or mentioned briefly for the purpose of ease and convenience in explanation.

Referring to FIGS. 4A and 4B, a semiconductor package 3 may include a substrate 100, a semiconductor chip 200, a molding layer 300, and a shielding layer 400'. The substrate 100, the semiconductor chip 200, and the molding layer 300 may be substantially the same as described with reference to FIGS. 1A and 1B.

The shielding layer 400' may include metal particles 410', a conductive carbon material 420, and a polymer 430. The metal particles 410', the conductive carbon material 420, and the polymer 430 may include the same materials as the metal particles 410, the conductive carbon material 420, and the polymer 430 described in the embodiments of FIGS. 1A to 1C or 3A, respectively. The metal particles 410' may include first particles 411 and second particles 412. The first particles 411 may have spherical or elliptical shapes, but are not limited thereto. The first particles 411 may be connected to each other. In some embodiments, at least two of the first particles 411 may be in contact with each other. In certain embodiments, at least two of the first particles 411 may be aggregated. A content of the first particles 411 may range from 2 wt % to 20 wt % in the shielding layer 400'. If the content of the first particles 411 is less than 2 wt % or greater than 20 wt % in the shielding layer 400', a resistance of the shielding layer 400' may be increased.

An aspect ratio (second aspect ratio) of the second particles 412 may be greater than an aspect ratio (first aspect ratio) of the first particles 411. For example, the aspect ratio of the second particles 412 may range from about 5 times to about 20 times the aspect ratio of the first particles 411. Here, the aspect ratio of a particle may mean a ratio of the maximum diameter of the particle to the minimum diameter of the particle. The second particles 412 may have high electrical conductivity because of their great aspect ratio. If the aspect ratio of the second particles 412 is less than 5 times the aspect ratio of the first particles 411, the shielding layer 400' may have low electrical conductivity. If the aspect ratio of the second particles 412 is greater than 20 times the aspect ratio of the first particles 411, a size of the shielding layer 400' may be excessively increased. The second particles 412 may have, but not limited to, plate or flake shapes. Some of the second particles 412 may be connected directly to each other. The first particles 411 may be provided between the second particles 412. The second particles 412 may be connected to the first particles 411. One of the second particles 412 may be connected to another of the second particles 412 through the first particles 411. In other words, even though the second particles 412 are spaced apart from each other, the second particles 412 may be electrically connected to each other through the first particles 411. The second particles 412 may include the same metal as or a different metal from the first particles 411. A content of the second particles 412 may range from 70 wt % to 90 wt % in the shielding layer 400'. If the content of the second particles 412 is less than 70 wt % in the shielding layer 400', a resistance of the shielding layer 400' may be increased. If the content of the second particles 412 is greater than 90 wt % in the shielding layer 400', bonding strength between the shielding layer 400' and the molding layer 300 may be reduced.

In some embodiments, the second particles 412 may be stacked on the molding layer 300. In the event that the second particles 412 are provided on a top surface of the molding layer 300, long axes of the second particles 412 may be substantially parallel to the top surface of the molding layer 300. In the event that the second particles 412 are provided on a sidewall of the molding layer 300, long axes of the second particles 412 may be substantially parallel to the sidewall of the molding layer 300. However, the arrangement of the long axes of the second particles 412 is not limited thereto.

The conductive carbon material 420 may be physically and electrically connected to at least one of the metal particles 410'. A content of the conductive carbon material 420 may range from 0.05 wt % to 5 wt % in the shielding layer 400'. If the content of the conductive carbon material 420 is less than 0.05 wt % in the shielding layer 400', the conductive carbon material 420 may be insufficient to electrically connect the second particles 412 to each other. If the content of the conductive carbon material 420 is greater than 5 wt % in the shielding layer 400', the content of the second particles 412 may be reduced and the resistance of the shielding layer 400' may be increased.

The polymer 430 may be substantially the same as the polymer 430 described with reference to FIGS. 1A and 1B. For example, the polymer 430 may be provided in a gap between the first particles 411, the second particles 412, and the conductive carbon material 420. The first particles 411, the second particles 412, and the conductive carbon material 420 may be bonded to the molding layer 300 by the polymer 430. A content of the polymer 430 may range from 7 wt % to 12 wt % in the shielding layer 400'. If the content of the polymer 430 is less than 7 wt % in the shielding layer 400', the bonding strength between the shielding layer 400' and the molding layer 300 may be reduced. If the content of the polymer 430 is greater than 12 wt % in the shielding layer 400', the resistance of the shielding layer 400' may be increased.

A mark 450 may be provided on the semiconductor package 3. The mark 450 may be the same as the mark 450 of FIGS. 1B, 1D, and 1E. Alternatively, the mark 450 may be the same as the mark 450 of FIG. 3A and may be formed by the same method as described in the embodiments of FIGS. 3B to 3D.

The semiconductor package 3 may be manufactured by the same method as described with reference to FIGS. 2A to 2D. However, the coating solution may include the metal particles 410', the conductive carbon material 420, the polymer 430, and the solvent. During the thermal treatment process of FIGS. 1B and 2C, the conductive carbon material 420 may be chemically bonded (e.g., covalently bonded) to one of the first particles 411 and the second particles 412. In certain embodiments, the conductive carbon material 420 may not be chemically bonded to the metal particles 410' but may be in contact with the metal particles 410'.

Figure 5:
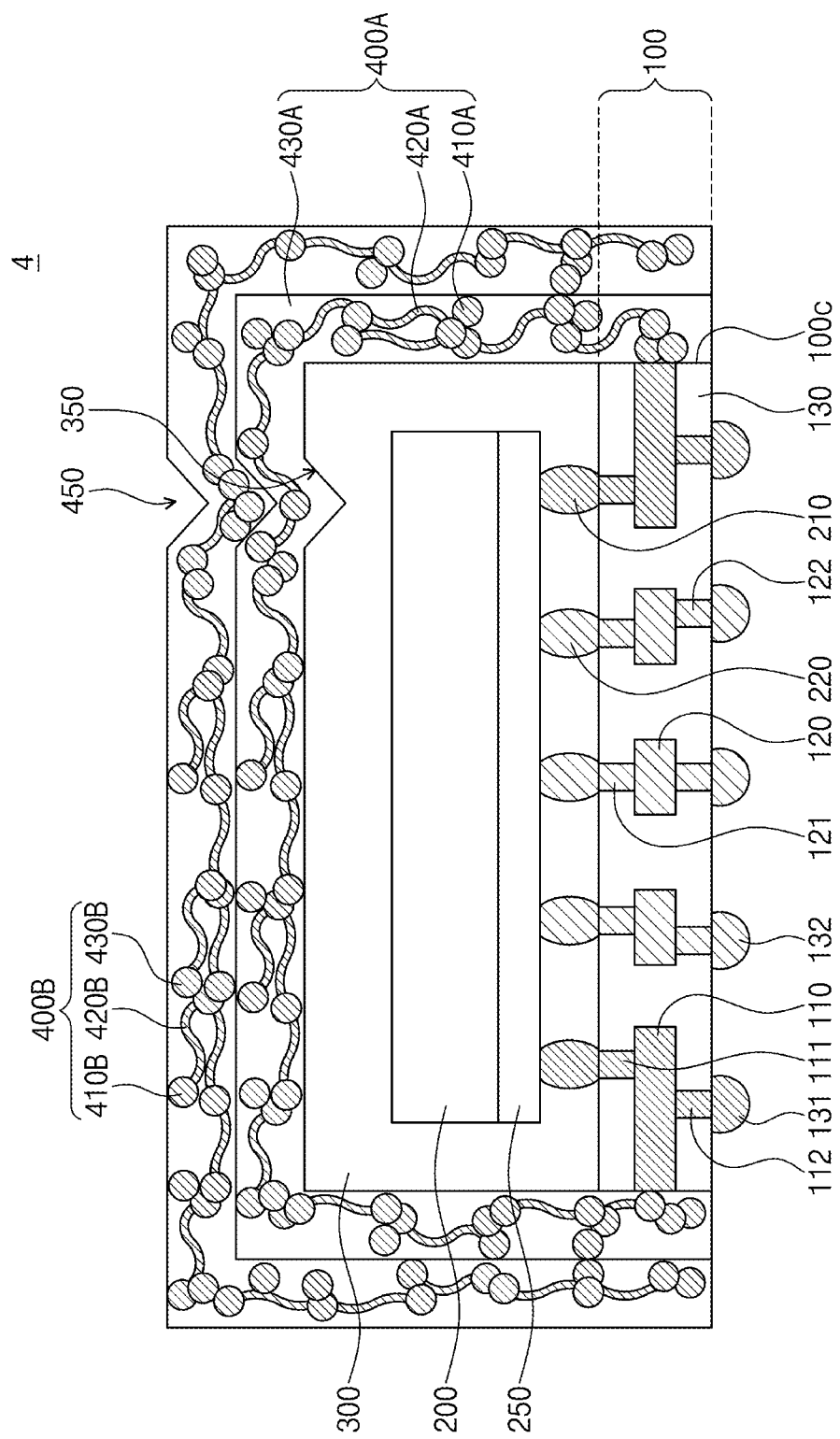
FIG. 5 is a cross-sectional view illustrating a semiconductor package according to an example embodiment.

FIG. 5 is a cross-sectional view illustrating a semiconductor package according to an example embodiment. Hereinafter, the descriptions to the same components as mentioned above will be omitted or mentioned briefly for the purpose of ease and convenience in explanation.

Referring to FIG. 5, a semiconductor package 4 may include a substrate 100, a semiconductor chip 200, a molding layer 300, a first shielding layer 400A, and a second shielding layer 400B. The substrate 100, the semiconductor chip 200, and the molding layer 300 may be the substantially same as described with reference to FIGS. 1A and 1B. The first shielding layer 400A may be the substantially same as the shielding layer 400 described with reference to FIGS. 1A and 1B. The first shielding layer 400A may be formed by the substantially same method as the method of forming the shielding layer 400 of FIGS. 2B to 2D. For example, the first shielding layer 400A may include first metal particles 410A, a first conductive carbon material 420A, and a first polymer 430A. The first metal particles 410A may be physically connected to each other by the thermal treatment process. The first conductive carbon material 420A may be bonded to the first metal particles 410A. The first shielding layer 400A may be electrically connected to the ground pattern 110 of the substrate 100.

The second shielding layer 400B may be formed on the first shielding layer 400A. The second shielding layer 400B may be formed by the substantially same method as the method of forming the shielding layer 400 of FIGS. 2B to 2D after the thermal treatment process of the first shielding layer 400A is completed. For example, a coating solution may be applied onto the first shielding layer 400A to form a second preliminary shielding layer, and the second preliminary shielding layer may be thermally treated to form the second shielding layer 400B. The second shielding layer 400B may include second metal particles 410B, a second conductive carbon material 420B, and a second polymer 430B. The second metal particles 410B may be physically connected to each other by the thermal treatment process. The second conductive carbon material 420B may be bonded to the second metal particles 410B. The second shielding layer 400B may be electrically connected to the first shielding layer 400A. For example, the second metal particles 410B may be connected to the first metal particles 410A or the first conductive carbon material 420A, or the second conductive carbon material 420B may be connected to the first metal particles 410A or the first conductive carbon material 420A. The semiconductor package 4 may include a plurality of the shielding layers 400A and 400B, and thus the electromagnetic interference of the semiconductor package 4 may be more sufficiently blocked. A third shielding layer may be provided on the second shielding layer 400B. The number of the shielding layers 400A and 400B may be variously modified. A total thickness of the shielding layers 400A and 400B may be adjusted by adjusting the number of the shielding layers 400A and 400B.

Figure 6:
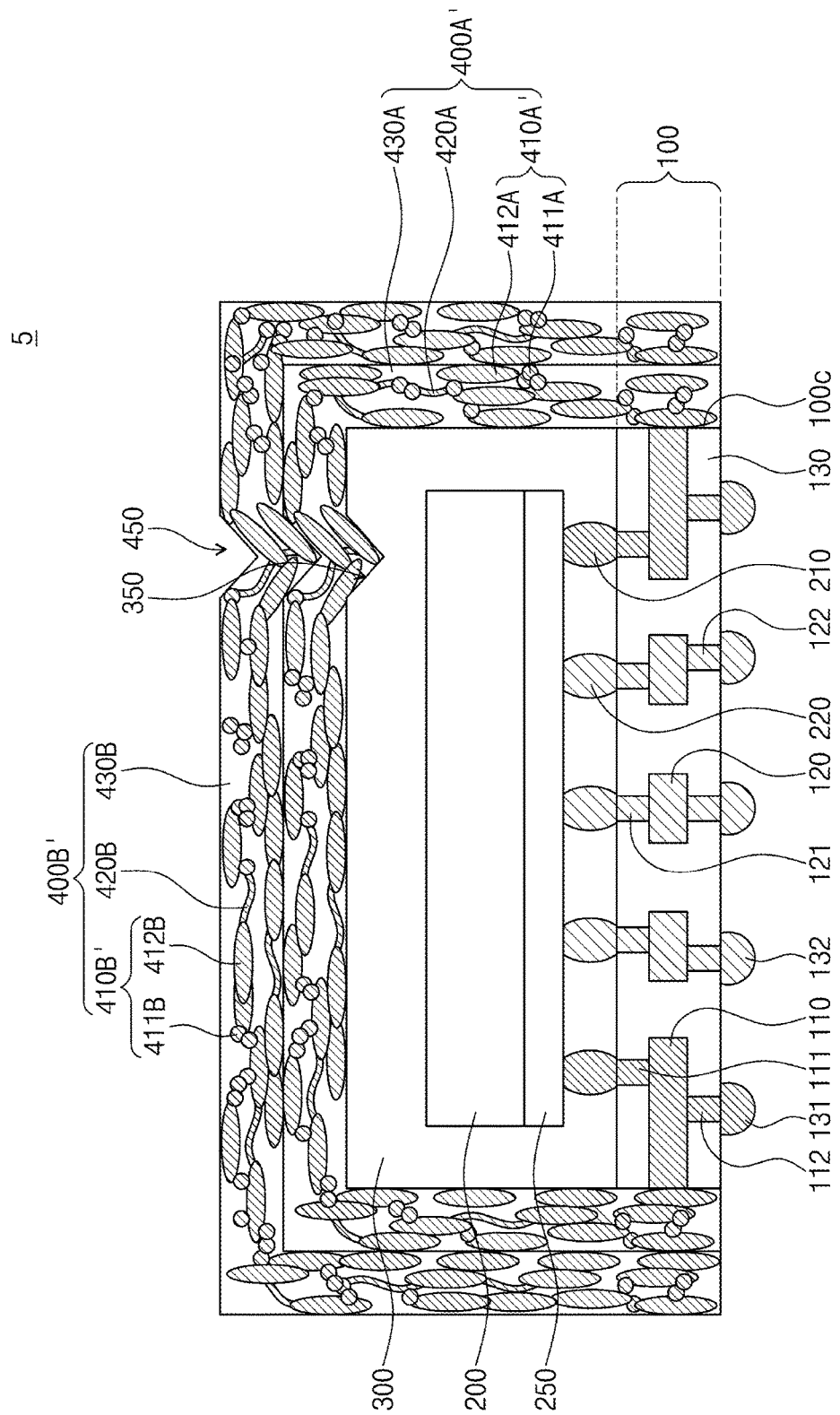
FIG. 6 is a cross-sectional view illustrating a semiconductor package according to an example embodiment.

FIG. 6 is a cross-sectional view illustrating a semiconductor package according to an example embodiment. Hereinafter, the descriptions to the same components as mentioned above will be omitted or mentioned briefly for the purpose of ease and convenience in explanation.

Figure 7:
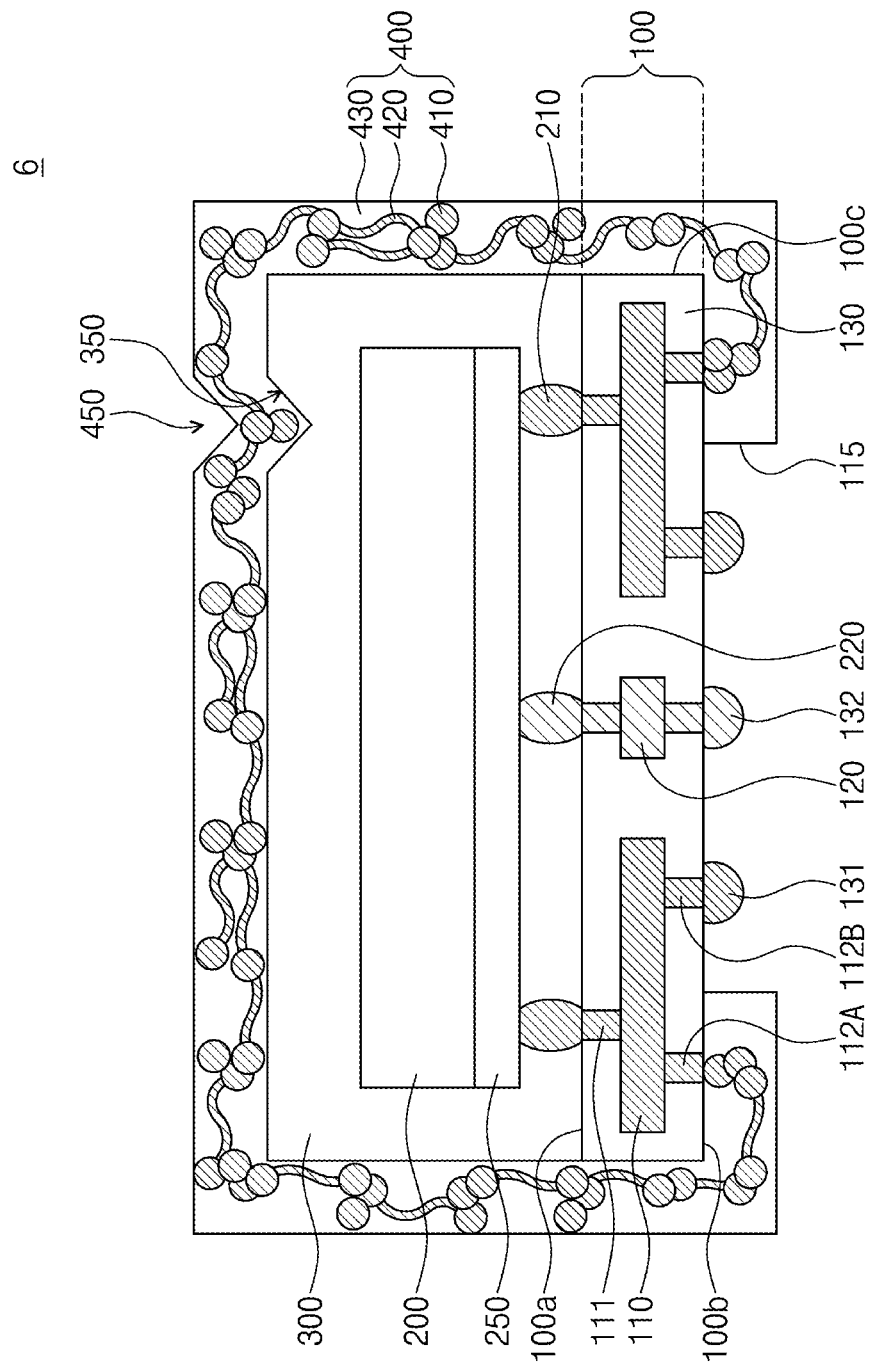
FIG. 7 is a cross-sectional view illustrating a semiconductor package according to an example embodiment.

Referring to FIG. 6, a semiconductor package 5 may include a semiconductor chip 200, a molding layer 300, a first shielding layer 400A', and a second shielding layer 400B'. The first shielding layer 400A' may include metal particles 410A', a first conductive carbon material 420A, and a first polymer 430A, and the metal particles 410A' may include first particles 411A and second particles 412A. The second shielding layer 400B' may include metal particles 410B', a second conductive carbon material 420B, a second polymer 430B, and the metal particles 410B' may include first particles 411B and second particles 412B. The metal particles 410A' and 410B', the first and second conductive carbon materials 420A and 420B, and the first and second polymers 430A and 430B may be substantially the same as the metal particles 410', the conductive carbon material 420, and the polymer 430 described with reference to FIGS. 4A and 4B, respectively. FIG. 7 is a cross-sectional view illustrating a semiconductor package according to an example embodiment. Hereinafter, the descriptions to the same components as mentioned above will be omitted or mentioned briefly for the purpose of ease and convenience in explanation.

Referring to FIG. 7, a semiconductor package 6 may include a substrate 100, a semiconductor chip 200, a molding layer 300, and a shielding layer 400. The substrate 100 may have a top surface 100a and a bottom surface 100b, which are opposite to each other. The semiconductor chip 200 and the molding layer 300 may be the substantially same as described with reference to FIGS. 1A and 1B. A ground structure may include a ground pattern 110, an upper ground via 111, and a lower ground via 112A and 112B. A plurality of the lower ground vias 112A and 112B may be provided. The lower ground vias 112A and 112B may include a first lower ground via 112A and a second lower ground via 112B. The first and second lower ground vias 112A and 112B may be electrically connected to a ground pattern 110. A ground terminal 131 may be provided on a bottom surface of the second lower ground via 112B. The ground pattern 110 may be spaced apart from the sidewall 100c of the substrate 100. Alternatively, in certain embodiments, the ground pattern 110 may extend to the sidewall 100c of the substrate 100 so as to be electrically connected to the shielding layer 400. A signal pattern 120 may be electrically isolated from the ground pattern 110 and the shielding layer 400.

The shielding layer 400 may further extend onto a bottom surface 100b of the substrate 100 and may be connected to the first lower ground via 112A. The shielding layer 400 may be grounded through the first lower ground via 112A, the ground pattern 110, the second lower ground via 112B, and the ground terminal 131. The shielding layer 400 may have a hole 115 exposing the ground and signal terminals 131 and 132. The shielding layer 400 may be spaced apart from the ground and signal terminals 131 and 132.

Figure 8:
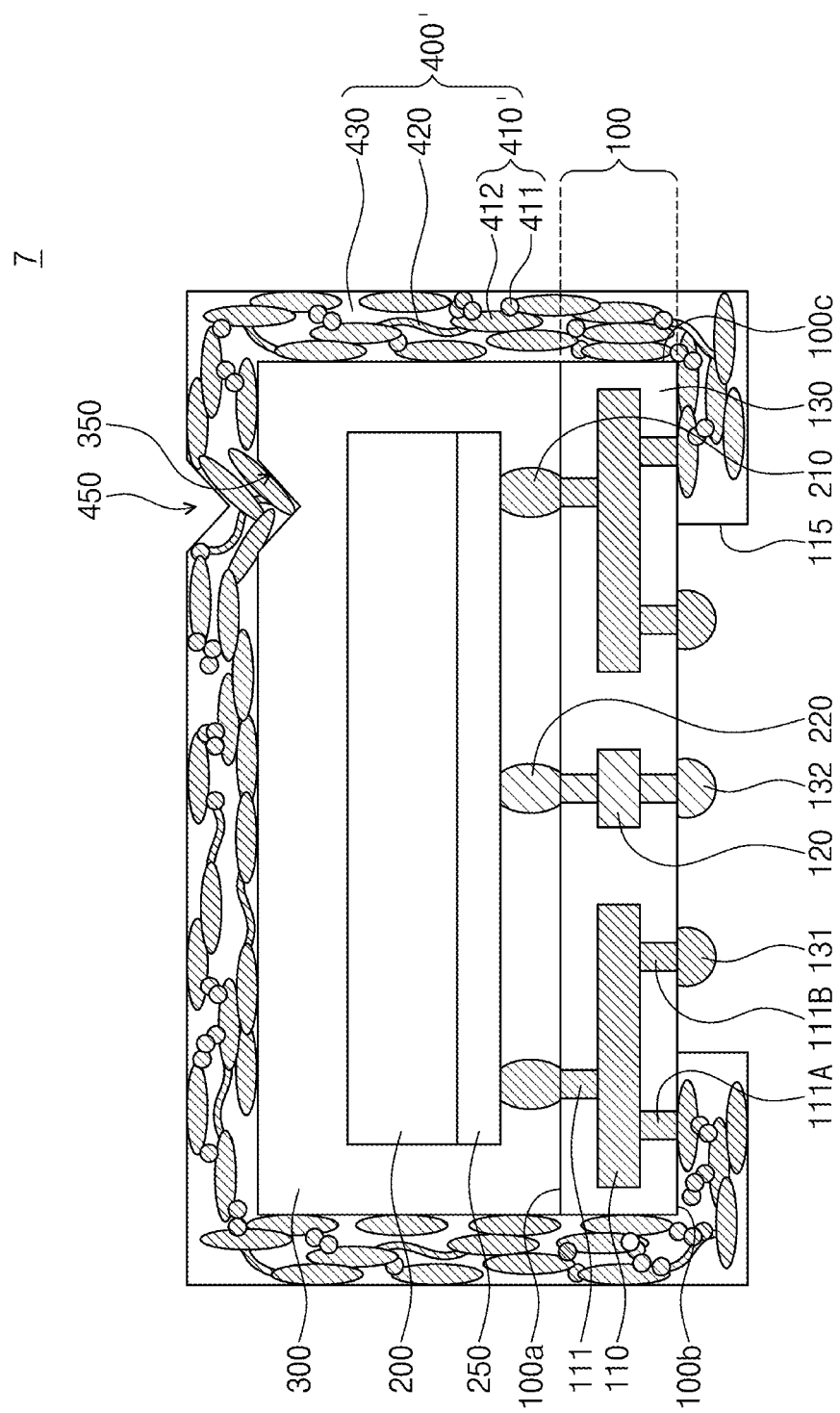
FIG. 8 is a cross-sectional view illustrating a semiconductor package according to an example embodiment.

FIG. 8 is a cross-sectional view illustrating a semiconductor package according to an example embodiment. Hereinafter, the descriptions to the same components as mentioned above will be omitted or mentioned briefly for the purpose of ease and convenience in explanation.

Referring to FIG. 8, a semiconductor package 7 may include a substrate 100, a semiconductor chip 200, a molding layer 300, and a shielding layer 400'. The semiconductor chip 200 and the molding layer 300 may be substantially the same as described with reference to FIGS. 1A and 1B. The substrate 100 may be substantially the same as described with reference to FIG. 7.

The shielding layer 400' may include the conductive carbon material 420, the polymer 430, and the metal particles 410' including the first and second particles 411 and 412, which are described with reference to FIGS. 4A and 4B. The shielding layer 400' may be provided on the molding layer 300. The shielding layer 400' may extend onto the bottom surface 100b of the substrate 100 so as to be connected to the first lower ground via 112A. The shielding layer 400' may be grounded through the first lower ground via 112A, the ground pattern 110, the second lower ground via 112B, and the ground terminal 131. The shielding layer 400' may have a hole 115 exposing the ground and signal terminals 131 and 132. The shielding layer 400' may be spaced apart from the ground and signal terminals 131 and 132.

Figure 9:
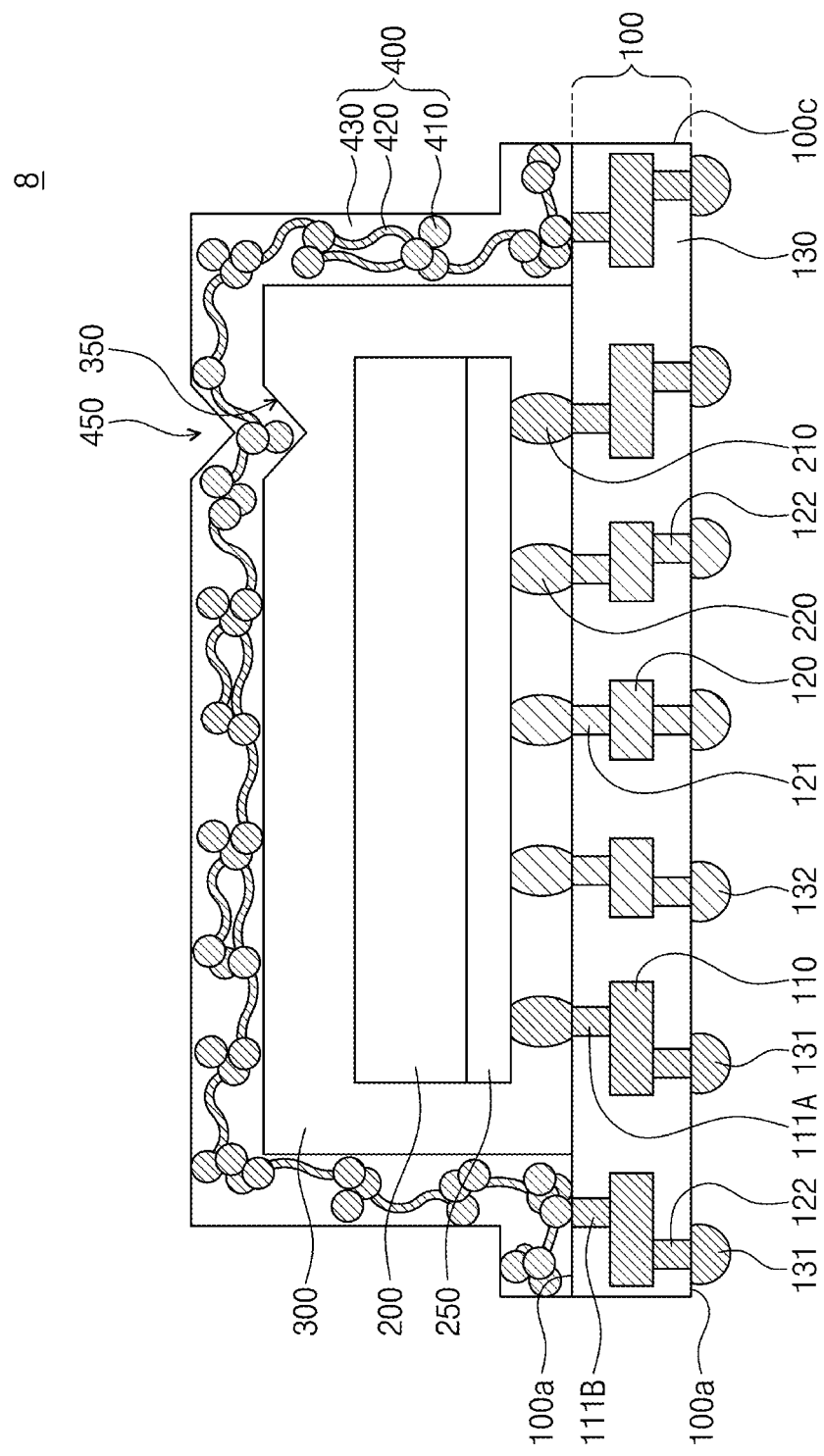
FIG. 9 is a cross-sectional view illustrating a semiconductor package according to an example embodiment.

FIG. 9 is a cross-sectional view illustrating a semiconductor package according to an example embodiment. Hereinafter, the descriptions to the same components as mentioned above will be omitted or mentioned briefly for the purpose of ease and convenience in explanation.

Referring to FIG. 9, a semiconductor package 8 may include a substrate 100, a semiconductor chip 200, a molding layer 300, and a shielding layer 400. The semiconductor chip 200 may be substantially the same as described with reference to FIGS. 1A and 1B.

A ground structure may include a ground pattern 110, upper ground vias 111A and 111B, and a lower ground via 112. The upper ground vias 111A and 111B may include a first upper ground via 111A and a second upper ground via 111B. The first upper ground via 111A may be substantially the same as the upper ground via 111 of FIGS. 1A and 1B. For example, the first upper ground via 111A may be connected to the ground interposer 210. The second upper ground via 111B may be disposed in an edge portion of the substrate 100 in a plan view. The second upper ground via 111B may be spaced apart from the molding layer 300 when viewed in a plan view. The ground pattern 110 may include a plurality of ground patterns 110, and the first and second ground vias 111A and 111B may be connected to the ground patterns 110 different from each other. Unlike FIG. 9, one ground pattern 110 may be connected to the first upper ground via 111A and the second upper ground via 111B.

The molding layer 300 may be disposed on a top surface 100a of the substrate 100. A width of the molding layer 300 may be smaller than a width of the substrate 100. In other words, the molding layer 300 may expose a portion (e.g., an edge portion) of the substrate 100. The molding layer 300 may expose at least a portion (e.g., the second upper ground via 111B) of the ground structure (110, 111A, 111B, and 112).

The shielding layer 400 may be disposed on the molding layer 300. The shielding layer 400 may extend onto the top surface 100a of the substrate 100 exposed by the molding layer 300 and may be connected to the second upper ground via 111B. The shielding layer 400 may be grounded through the second upper ground via 111B, the ground pattern 110, the lower ground via 112, and the ground terminal 131. In some embodiments, the shielding layer 400 may further extend onto a sidewall 100c of the substrate 100. However, embodiments of the inventive concepts are not limited thereto.

FIG. 10 is a cross-sectional view illustrating a semiconductor package according to an example embodiment. Hereinafter, the descriptions to the same components as mentioned above will be omitted or mentioned briefly for the purpose of ease and convenience in explanation.

Referring to FIG. 10, a semiconductor package 9 may include a substrate 100, a semiconductor chip 200, a molding layer 300, and a shielding layer 400'. The semiconductor chip 200 may be substantially the same as described with reference to FIGS. 1A and 1B. The substrate 100, the ground structure (110, 111A, 111B and 112), and the molding layer 300 may be substantially the same as described with reference to FIG. 9.

The shielding layer 400' may include the conductive carbon material 420, the polymer 430, and the metal particles 410' including the first and second particles 411 and 412, which are described with reference to FIGS. 4A and 4B. The shielding layer 400' may extend onto the top surface 100a of the substrate 100 exposed by the molding layer 300 and may be connected to the second upper ground via 111B. The shielding layer 400' may be grounded through the second upper ground via 111B, the ground pattern 110, the lower ground via 112, and the ground terminal 131. In some embodiments, the shielding layer 400' may further extend onto the sidewall 100c of the substrate 100. However, embodiments of the inventive concepts are not limited thereto. According to some example embodiments, the shielding layer may prevent the electromagnetic interference (EMI) of the semiconductor package. The metal particles may be physically connected to each other. The conductive carbon material may be physically and electrically connected to the metal particles. Thus, the resistance of the shielding layer may be reduced. Since the resistance of the shielding layer is reduced, it is possible to improve the EMI shielding characteristic of the shielding layer.

According to some example embodiments, the mark having the visibility may be formed on the semiconductor package.

While example embodiments have been described, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A semiconductor package comprising:
 a substrate comprising a ground structure that is exposed at one surface of the substrate;
 a semiconductor chip provided on the substrate;
 a molding layer provided on the substrate and covering the semiconductor chip; and
 a shielding layer provided on the molding layer and the one surface of the substrate, the shielding layer being in contact with the ground structure,
 wherein the shielding layer comprises:
 metal particles directly connected to each other; and
 a conductive carbon material electrically connected to at least one of the metal particles.

2. The semiconductor package of claim 1, wherein a surface of the molding layer has a recess having a depth of at least 20 µm,
  wherein a first portion of the shielding layer is provided outside the recess,
  wherein a second portion of the shielding layer is provided on the recess, and
  wherein an angle between a first top surface of the first portion of the shielding layer and a second top surface of the second portion of the shielding layer ranges from 130 degrees to 160 degrees.

3. The semiconductor package of claim 2, wherein the first portion of the shielding layer reflects a first wavelength of a light and the second portion of the shielding layer reflects a second wavelength of the light that is different from the first wavelength, and
  wherein the shielding layer further comprises titanium oxide.

4. The semiconductor package of claim 1, wherein the metal particles comprise:
  a first particle having a first aspect ratio; and
  a second particle having a second aspect ratio that is greater than the first aspect ratio, and
  wherein the second particle is in contact with the first particle.

5. The semiconductor package of claim 1, wherein the conductive carbon material is covalently bonded to at least one of the metal particles, and
  wherein at least two of the metal particles are aggregated with each other.

6. The semiconductor package of claim 1, wherein the substrate further comprises a signal pattern that is electrically insulated from the shielding layer.

7. The semiconductor package of claim 1, wherein the one surface of the substrate includes a sidewall of the substrate, and
  wherein the semiconductor chip and the molding layer are disposed on a top surface of the substrate.

8. The semiconductor package of claim 1, wherein the one surface of the substrate includes a bottom surface of the substrate, and
  wherein the semiconductor chip and the molding layer are disposed on a top surface of the substrate.

9. The semiconductor package of claim 1, wherein the molding layer is disposed on the one surface of the substrate and exposes at least a portion of the ground structure.

10. A semiconductor package comprising:
  a substrate comprising a ground structure that is exposed at one surface of the substrate;
  a semiconductor chip provided on the substrate;
  a molding layer provided on the substrate and covering the semiconductor chip, a top surface of the molding layer having a recess; and
  a shielding layer provided on the molding layer, the shielding layer comprising metal particles directly connected to each other, and a conductive carbon material electrically connecting the metal particles,
  wherein the shielding layer is recessed at the recess of the top surface of the molding layer.

11. The semiconductor package of claim 10, wherein a first portion of the shielding layer is provided on the top surface of the molding layer outside of the recess, and a second portion of the shielding layer is provided on the recess, and
  wherein the first portion has a first top surface, and the second portion has a second top surface that is inclined with respect to the first top surface.

12. The semiconductor package of claim 11, wherein an angle between the first top surface of the first portion of the shielding layer and the second top surface of the second portion of the shielding layer ranges from 130 degrees to 160 degrees.

13. The semiconductor package of claim 11, wherein a first intensity of a light reflected from the first portion of the shielding layer is different from a second intensity of the light reflected from the second portion of the shielding layer.

14. The semiconductor package of claim 1, wherein the shielding layer further comprises a polymer, and
  wherein the metal particles are dispersed throughout the polymer.

15. The semiconductor package of claim 14, wherein the metal particles are physically in contact with each other.

16. The semiconductor package of claim 10, wherein the shielding layer further comprises a polymer, and
  wherein the metal particles are dispersed throughout the polymer.

17. The semiconductor package of claim 10, wherein the recess has a V-shaped cross section.

18. The semiconductor package of claim 10, wherein the metal particles comprise:
  a first particle having a spherical shape;
  a second particle having the spherical shape; and
  a third particle having an elongated shape, and
  wherein the third particle is in contact with and interposed between the first particle and the second particle.

19. A semiconductor package comprising:
  a substrate comprising a ground structure that is exposed at one surface of the substrate;
  a semiconductor chip provided on the substrate; and
  a shielding layer provided on the one surface of the substrate, the shielding layer being in contact with the ground structure,
  wherein the shielding layer comprises:
  metal particles directly connected to each other; and
  a conductive carbon material electrically connected to at least one of the metal particles.

20. The semiconductor package of claim 19, wherein a recess is provided on a top surface of the shielding layer,
  wherein a first portion of the shielding layer is provided outside the recess,
  wherein a second portion of the shielding layer is provided on the recess, and
  wherein an angle between a first top surface of the first portion of the shielding layer and a second top surface of the second portion of the shielding layer ranges from 130 degrees to 160 degrees.

* * * * *